US006596458B1

(12) United States Patent
Sato et al.

(10) Patent No.: US 6,596,458 B1
(45) Date of Patent: Jul. 22, 2003

(54) POSITIVE-WORKING PHOTORESIST COMPOSITION

(75) Inventors: Kenichiro Sato, Shizuoka (JP); Kunihiko Kodama, Shizuoka (JP); Toshiaki Aoai, Shizuoka (JP); Yasumasa Kawabe, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/563,436

(22) Filed: May 3, 2000

(30) Foreign Application Priority Data

| May 7, 1999 | (JP) | ............................................. | 11-127296 |
| Jun. 30, 1999 | (JP) | ............................................. | 11-186607 |
| Jul. 7, 1999 | (JP) | ............................................. | 11-193601 |
| Jul. 7, 1999 | (JP) | ............................................. | 11-193602 |
| Jul. 7, 1999 | (JP) | ............................................. | 11-193603 |

(51) Int. Cl.$^7$ ............................................. G03F 7/039
(52) U.S. Cl. ..................................... 430/270.1; 430/910
(58) Field of Search ............................... 430/270.1, 910

(56) References Cited

U.S. PATENT DOCUMENTS

| 6,013,416 A | | 1/2000 | Nozaki et al. ............ 430/283.1 |
| 6,087,063 A | * | 7/2000 | Hada et al. ............... 430/270.1 |
| 6,207,342 B1 | * | 3/2001 | Takechi et al. .......... 430/270.1 |
| 6,280,898 B1 | * | 8/2001 | Hasegawa et al. ....... 430/270.1 |
| 6,291,130 B1 | * | 9/2001 | Kodama et al. ......... 430/270.1 |
| 6,303,266 B1 | * | 10/2001 | Okino et al. ............. 430/270.1 |
| 6,348,297 B1 | * | 2/2002 | Uetani et al. ............ 430/270.1 |

* cited by examiner

Primary Examiner—John S. Chu
(74) Attorney, Agent, or Firm—Sughrue Mion, PLLC

(57) ABSTRACT

Disclosed is a positive-working photoresist composition having reduced development defects, and excellent in resist pattern profiles and in the resolving power of contact holes, which comprises (i) a compound generating an acid by irradiation of active light or radiation, and (ii) a resin containing repeating units of at least one kind selected from the group consisting of (a) repeating units having alkali-soluble groups each protected with at least one group selected from the group consisting of groups containing alicyclic hydrocarbon structures represented by specific general formulas (pI) to (pVI), (b) repeating units represented by specific general formula (II) and (c) repeating units represented by specific general formulas (III-a) to (III-d), and decomposed by the action of an acid to increase the solubility of the resin into an alkali.

8 Claims, No Drawings

POSITIVE-WORKING PHOTORESIST COMPOSITION

FIELD OF THE INVENTION

The present invention relates to a positive-working photoresit composition used in an ultramicrolithography process or another photofabrication process for the production of very large scale integrated circuits or high capacity microchips, and particularly to a positive-working photoresist composition which can form highly miniaturized patterns by use of light within the range of far ultraviolet rays including excimer laser beams, particularly light having a wavelength of 250 nm.

More particularly, the invention relates to a positive-working photoresist composition in which development defects are prevented from being generated, and which is excellent in resist pattern profiles obtained and in the resolving power of contact holes.

BACKGROUND OF THE INVENTION

In recent years, integrated circuits have been progressively increased in their integration degree, and therefore processing of ultra-micro patterns having a line width of a half micron or less has become necessary in the production of semiconductor substrates for very large scale integrated circuits. For fufilling this necessity, the wavelength of light used in an exposure apparatus employed for photolithography becomes progressively shorter, and now, of the far ultraviolet rays, excimer laser light having a short wavelength (such as XeCl, KrF or ArF) has been studied for the use.

Used in the pattern formation of lithography in this wavelength region are chemical amplification system resists.

In general, the chemical amplification system resists can be roughly divided into three classes, commonly called as a 2-component system, a 2.5-component system and a 3-component system. In the 2-component system, a compound generating an acid by photolysis (hereinafter referred to as a photoacid generator) is combined with a binder resin. The binder resin is a resin having a group which is decomposable by the action of an acid to enhance the solubility of the resin into an alkali developing solution (also referred to as an acid-decomposable group) in its molecule. The 2.5-component system contains a low molecular weight compound further having an acid-decomposable group in addition to such a 2-component system. The 3-component system contains the photoacid generator, the alkali-soluble resin and the low molecular weight compound.

The chemical amplification system resists are suitable for photoresists for ultraviolet or far ultraviolet ray irradiation. However, they are further required to comply with desired characteristics at the time when used. When a ArF excimer laser is used as a light source, photoresist compositions are proposed in which (meth)acrylic resins smaller in absorption than partially hydroxylated styrenic resins are combined with compounds generating acids by light. For example, they are described in JP-A-7-199467 (the term "JP-A" as used herein means an "unexamined published Japanese patent application") and JP-A-7-252324. Above all, JP-A-6-289615 discloses resins in which each organic group of tertiary carbon is attached by an ester linkage to oxygen of a carboxyl group of acrylic acid.

Further, JP-A-7-234511 discloses acid-decomposable resins having acrylic esters or fumaric esters as repeating units. However, the fact is that they are insufficient in pattern profiles and adhesion to substrates, resulting in failure to obtain their sufficient performance.

Furthermore, resins are proposed into which alicyclic hydrocarbon sites are introduced for imparting dry etching resistance.

In JP-A-9-73173, JP-A-9-90637 and JP-A-10-161313, resist materials are described in which acid-sensitive compounds are used, the compounds containing alkali-soluble groups protected with alicyclic group-containing structures and structure units which make the compounds alkali-soluble by eliminating the alkali-soluble groups with acids.

Besides, in JP-A-9-90637, JP-A-10-207069 and JP-A-10-274852, resist compositions containing acid-decomposable resins having specific lactone structures are described.

In the chemical amplification system photoresists or ArF exposure, the acid-decomposable group-containing resins have been variously studied as described above. However, there is still room for improvement in the resins. That is to say, the acid-decomposable resins used in the chemical amplification system photoresists deteriorate the shape of profiles (the top shape of profiles becomes pent roof-like), the resolving power (particularly, the resolving power of contact holes) and the development properties (development defects and scumming) in some cases. Copolymerization of further monomers for solving these problems results in deterioration of the sensitivity. In particular, there is no guideline for improving development defects in the present circumstances.

Accordingly, in the present circumstances, it is not clear how the resist compositions should be designed as means for solving these problems.

As described above, the resins are proposed into which alicyclic hydrocarbon sites are introduced for imparting dry etching resistance. However, as a harmful effect of the introduction of alicyclic hydrocarbon sites, the systems become extremely hydrophobic. Accordingly, the phenomena are observed that the development with aqueous solutions of tetramethylammonium hydroxide (hereinafter referred to as TMAH) which have hitherto been widely used as resist developing solutions becomes difficult, and that resists are separated from substrates during development.

For complying with such resists made hydrophobic, it has been studied that organic solvents such as isopropyl, alcohol are mixed with developing solutions. This has produced results to some degree. However, there is a fear of swelling of resist films, and the process becomes complicated. It is therefore not necessarily said that the problems have been dissolved.

As approaches for improving the resists, many measures have been taken in which various hydrophobic alicyclic hydrocarbon sites are compensated for by the introduction of hydrophilic groups.

In general, monomers having carboxylic acid sites such as acrylic acid and methacrylic acid, or monomers having hydroxyl groups or cyano groups in their molecules such as HEMA and acrylonitrile are copolymerized with monomers having alicyclic hydrocarbon groups, thereby aiming at the solution to the problem or the development properties. However, this is utterly insufficient.

On the other hand, methods for imparting dry etching resistance utilizing alicyclic hydrocarbon sites as main chains of polymers are also studied, in addition to methods of introducing alicyclic hydrocarbon sites into side chains of the acrylate monomers. However, this system also has the above-mentioned problems, and improvements by similar approaches have been studied.

In JP-A-10-254139, resin compositions are described each of which comprises an acid-decomposable group-containing resin having an alicyclic skeleton, a radiation-sensitive acid generator and a mixed solvent comprising a straight-chain ketone and at least one selected from the group consisting of a cyclic ketone, a propylene glycol monoalkyl ether acetate land an alkyl 2-hydroxypropionate. However, this system also has the above-mentioned problems, and improvements by similar approaches have been studied.

In the chemical amplification system photoresists for far ultraviolet ray exposure, various resins containing acid-decomposable groups have been studied as described above. However, there is still room for improvement, caused by the hydrophobicity of the resins. That is to say, when the chemical amplification system photoresists are stored in the solution state, there are still the problems that particles are produced in solutions and that the resist performance is deteriorated (deterioration of the storage stability of the resist solutions) because of poor miscibility of the resins with photoacid generators.

With recent demands towards miniaturization of semiconductor chips, design patterns of the micro semiconductors have reached the micro region of 0.13 μm to 0.35 μm. However, these compositions have the problem that the resolving power of the patterns is disturbed by factors such as the edge roughness of line patterns. The term "edge roughness" as used herein means that top and bottom edges of a line pattern of a resist look uneven when the pattern is seen from above, because the edges irregularly fluctuate perpendicularly to a line direction caused by the characteristics of the resist.

As described above, according to the known art of the conventional photoresist compositions, the roughness is observed on the pattern edges, and stable patterns can not be obtained. Accordingly, further improvements have been desired.

SUMMARY OF THE INVENTION

It is therefore an object of the invention to solve the problems in respect to techniques for improving the original performance of the micro photofabrication using far ultraviolet light, particularly ArF excimer laser light, and particularly to provide a positive-working resist composition in which development defects are prevented from being generated, and which is excellent in resist pattern profiles obtained and in the resolving power of contact holes.

Another object of the invention is to provide a positive-working resist composition for far ultraviolet ray exposure excellent in the storage stability of a resist solution.

Still another object of the invention is to provide a positive-working photoresist composition of the chemical amplification system having high resolving power and improved in the edge roughness of a pattern.

The present inventors have made intensive studies of constituent materials of resist compositions in the positive-working chemical amplification system. As a result, the inventors have known that the objects of the invention are attained by using specific acid-decomposable resins and specific mixed solvents, thus completing the invention.

That is to say, these and other objects of the invention are attained by the following:

(1) A positive-working photoresist composition comprising (i) a compound generating an acid by irradiation of active light or radiation, and (ii) a resin containing repeating units of at least one kind selected from the group consisting of (a) repeating units having alkali-soluble groups each protected with at least one group selected from the group consisting of groups containing alicyclic hydrocarbon structures represented by the following general formulas (pI) to (pVI), (b) repeating units represented by the following general formula (II) and (c) repeating units represented by the following general formulas (III-a) to (III-d), and decomposed by the action of an acid to increase the solubility of the resin into an alkali;

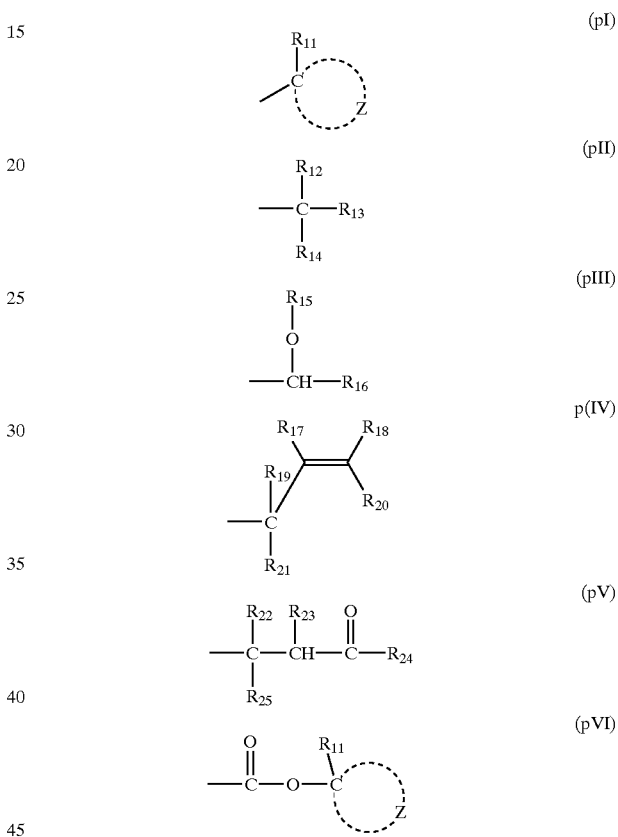

wherein $R_{11}$ represents a methyl group, an ethyl group, a n-propyl group, an isopropyl group, a n-butyl group, an isobutyl group or a sec-butyl group; Z represents an atomic group necessary to form an alicyclic hydrocarbon group together with a carbon atom; $R_{12}$ to $R_{15}$ each independently represents a straight-chain or branched alkyl group having 1 to 4 carbon atoms or an alicyclic hydrocarbon group, with the proviso that at least one of $R_{12}$ to $R_{14}$ or either of $R_{15}$ and $R_{16}$ represents an alicyclic hydrocarbon group; $R_{17}$ to $R_{21}$ each independently represents a hydrogen atom, a straight-chain or branched alkyl group having 1 to 4 carbon atoms or an alicyclic hydrocarbon group, with the proviso that at least one of $R_{17}$ to $R^{21}$ represents an alicyclic hydrocarbon group; further, either of $R_{19}$ and $R_{21}$ represents a straight-chain or branched alkyl group having 1 to 4 carbon atoms or an alicyclic hydrocarbon group; and $R_{22}$ to $R_{25}$ each independently represents a straight-chain or branched alkyl group having 1 to 4 carbon atoms or an alicyclic hydrocarbon group, with the proviso that at least one of $R_{22}$ to $R_{25}$ represents an alicyclic hydrocarbon group;

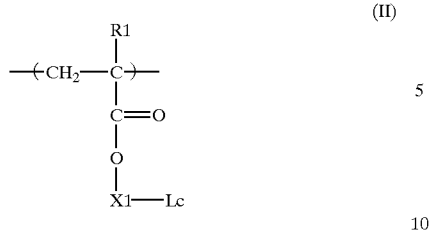

wherein R1 represents a hydrogen atom, a halogen atom or a straight-chain or branched alkyl group having 1 to 4 carbon atoms; X1 represents a divalent connecting group; and Lc represents a lactone group; and

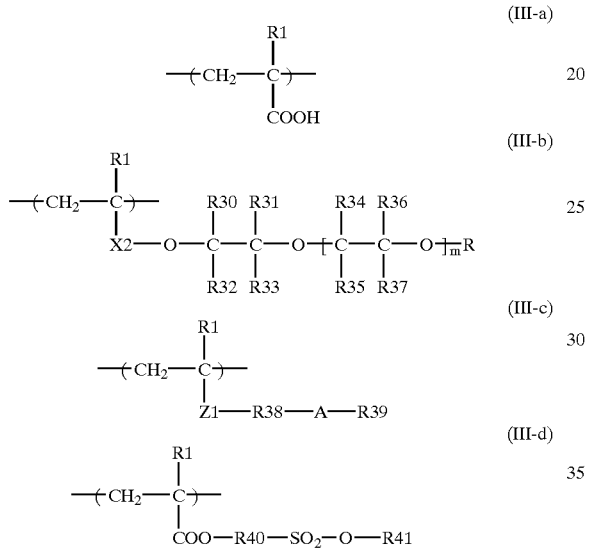

wherein R1 represents a hydrogen atom, a halogen atom or a straight-chain or branched alkyl group having 1 to 4 carbon atoms; R30 to R37 each independently represents a hydrogen atom or an alkyl group which may have a substituent; R represents a hydrogen atom or an alkyl, cyclic alkyl, aryl or aralkyl group which may have a substituent; m represents an integer of 1 to 10; X2 represents a divalent group selected from the group consisting of a single bond, an alkylene group, a cyclic alkylene group, an arylene group, an ether group, a thioether group, a carbonyl group, an ester group, an amido group, a sulfonamido group, a urethane group and a urea group, which may have substituents, may be used alone or as a combination of two or more of them, and are not decomposed by the action of an acid; Z1 represents a single bond, an ether group, an ester group, an amido group, an alkylene group or a divalent group in which they are combined; R38 represents a single bond, an alkylene group, an arylene group or a divalent group in which they are combined; R40 represents an alkylene group, an arylene group or a divalent group in which they are combined; R39 represents an alkyl, cyclic alkyl, aryl or aralkyl group which may have a substituent; R41 represents a hydrogen atom or an alkyl, cyclic alkyl, alkenyl, aryl or aralkyl group which may have a substituent; and A represents any one of the following functional groups:

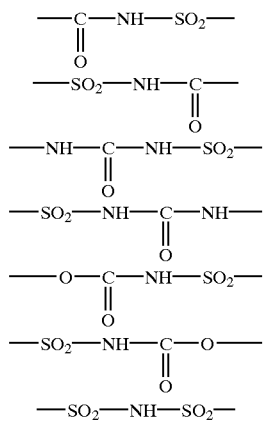

(2) The positive-working photoresist composition of (1), wherein the resin of (ii) is a resin containing repeating units of at least one kind selected from the group consisting of repeating units represented by the following general formula (I') repeating units represented by the following general formula (II') and repeating units represented by general formulas (III-a) to (III-d), and increased in the rate of dissolution into an alkali developing solution by the action of an acid;

wherein $R_1$ represents a hydrogen atom or a methyl group; $R_2$ represents an alkyl group having 1 to 4 carbon atoms; and $R_3$ and $R_4$ each independently represents a hydrogen atom or an alkyl group having 1 to 4 carbon atoms;

(3) The positive-corking photoresist composition of (1) further comprising (iii) a mixed solvent selected from the group consisting of (iii-i) a mixed solvent containing (1) propylene glycol monomethyl ether acetate or propylene glycol monomethyl ether propionate and (2) at least one of ethyl lactate, propylene glycol monomethyl ether and ethoxyethyl propionate; (iii-2) a mixed solvent containing (1) propylene glycol monomethyl ether acetate or propylene glycol monomethyl ether propionate and (2) at least one of γ-butyrolactone, ethylene carbonate and propylene carbonate; (iii-3) a mixed solvent containing (1) heptanone and (2) at least one of ethyl lactate, propylene glycol monomethyl ether and ethoxy-ethyl propionate; and (iii-4) a mixed solvent containing (1) heptanone and (2) at least one of γ-butyrolactone, ethylene carbonate and propylene carbonate;

(4) The positive-working photoresist composition of (1) further comprising (iv) an organic basic compound; and (5) The positive-working photoresist composition of (1) further comprising (v) a fluorine and/or silicon surfactant.

DETAILED DESCRIPTION OF THE INVENTION

The compounds used in the invention are described in detail below.

<(i) Compound Generating Acid by Irradiation of Active Light or Radiation (Photoacid Generator)>

The photoacid generator used in the invention is a compound generating an acid by irradiation of active light or radiation.

As the photoacid generators used in the invention, photoinitiators for cationic photo-polymerization, photoinitiators for radical photo-polymerization, photodecolorizing agents and photodiscoloring agents for dyes, or compounds generating acids by irradiation of known light used in microresists (ultraviolet rays of 400 nm to 200 nm, far ultraviolet rays, particularly preferably g-line, h-line, i-line, KrF excimer laser beams), ArF excimer laser beams, electron beams, X-rays, molecular beams or ion beams, and mixtures thereof can be appropriately selected and used.

Examples of the other photoacid generators used in the invention include onium salts such as diazonium salts, ammonium salts, phosphonium salts, iodonium salts, sulfonium salts, selenonium salts and arsonium salts, organic halogen compounds, organic metal/organic halides, photoacid generators having o-nitrobenzyl type protective groups, compounds producing sulfonic acids by photolysis which are represented by iminosulfonates, disulfone compounds, diazoketosulfone compounds and diazodisulfone compounds.

Further, compounds in which these groups or compounds generating acids with light are introduced into their main chains or side chains can be used.

Furthermore, compounds generating acids with light can also be used which are described in V. N. R. Pillai *Synthesis*, (1) 1 (1980), A. Abad et al., *Tetrahedron Lett.*, (47), 4555 (1971) D. H. R. Barton et al.,*J. Chem. Soc.*, (C), 329 (1970), U.S. Pat. No. 3,779,778 and European Patent 126,712.

Of the compounds which are decomposable by irradiation of active light or radiation to generate acids, compounds particularly effectively used are described below.

(1) Oxazole derivatives substituted by trihalomethyl groups, which are represented by the following general formula (PAG1), or S-triazine derivatives represented by the following general formula (PGA2):

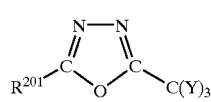
(PAG1)

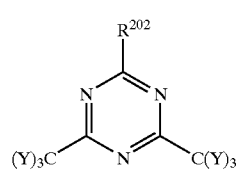
(PGA2)

wherein $R^{201}$ represents a substituted or unsubstituted aryl or alkenyl group; $R^{202}$ represents a substituted or unsubstituted aryl, alkenyl or alkyl group, or —C(Y)$_3$; and Y represents a chlorine atom or a bromine atom.

Specific examples thereof include but are not limited to the following compounds:

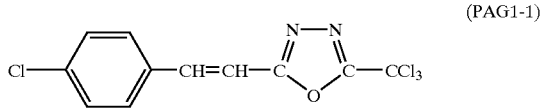
(PAG1-1)

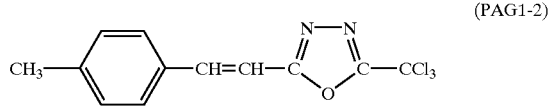
(PAG1-2)

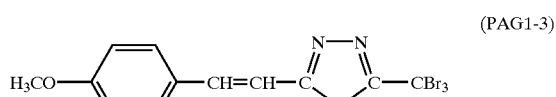
(PAG1-3)

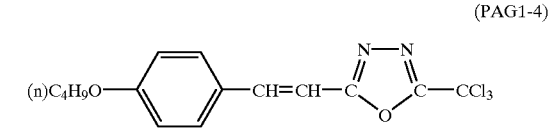
(PAG1-4)

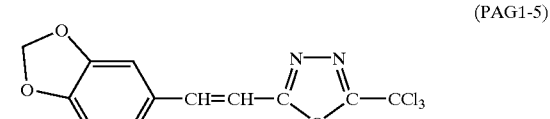
(PAG1-5)

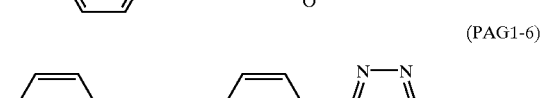
(PAG1-6)

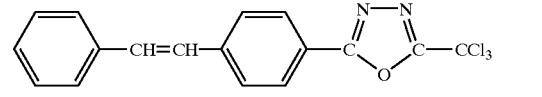
(PAG1-7)

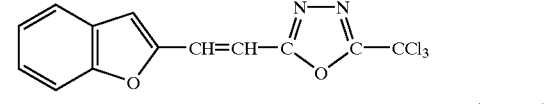
(PAG1-8)

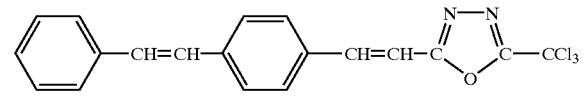
(PAG2-1)

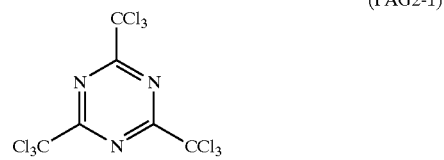
(PAG2-2)

(PAG2-3)
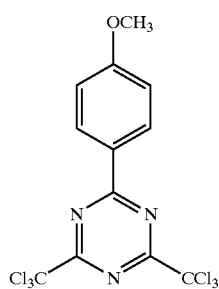
(PAG2-4)
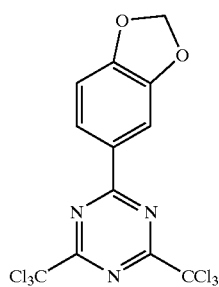
(PAG2-5)
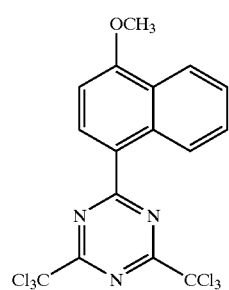
(PAG2-6)
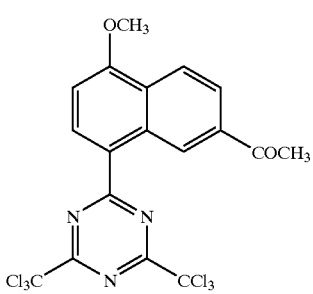
(PAG2-7)
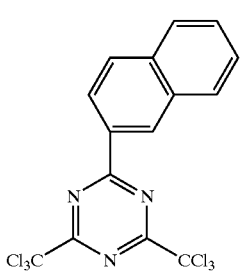
(PAG2-8)
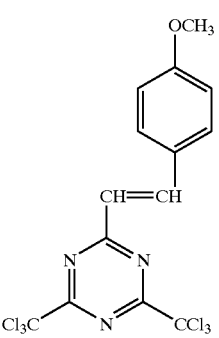
(PAG2-9)
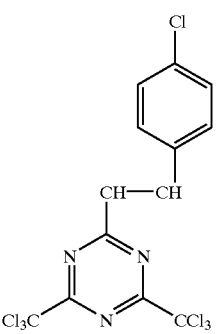
(PAG2-10)
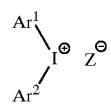
(2) Iodonium salts represented by the following general formula (PAG3) or sulfonium salts represented by the following general formula (PAG4):
(PAG3)
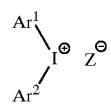
(PAG4)
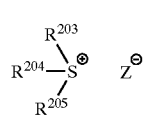

wherein $Ar^1$ and $Ar^2$ each independently represents a substituted or unsubstituted aryl group; and $R^{203}$, $R^{204}$ and $R^{205}$ each independently represents a substituted or unsubstituted alkyl or aryl group.

$Z^-$ represents a counter anion, and examples thereof include but are not limited to $BF_4^-$, $AsF_6^-$, $PF_6^-$, $SbF_6^{2-}$, $SiF_6^{2-}$, $ClO_4^-$, perfluoroalkanesulfonic acid anions such as $CF_3SO_3^-$, pentafluorobenzenesulfonic acid anions, condensed polynuclear aromatic sulfonic acid anions such as naphthalene-1-sulfonic acid anions, anthraquinonesulfonic acid anions and sulfonic acid group-containing dyes.

Further, two of $R^{203}$, $R^{204}$ and $R^{205}$, and $Ar_1$ and $A_2$ may each combine together through each single bond or substituent group.

Specific examples thereof include but are not limited to the following compounds:

(PAG3-1)
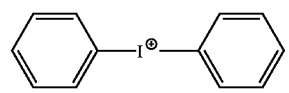

(PAG3-2)
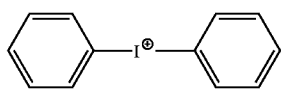

(PAG-3-3)
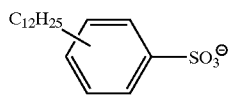

(PAG3-4)
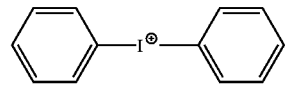

(PAG3-5)
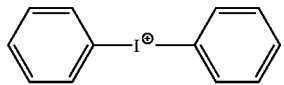

(PAG3-6)
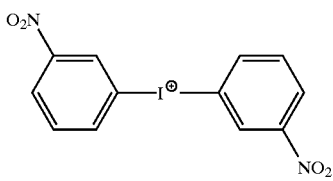

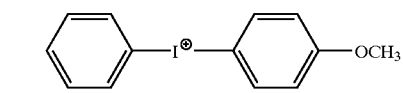

(PAG3-7)
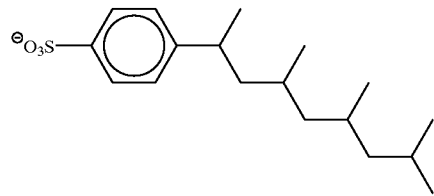

(PAG3-8)
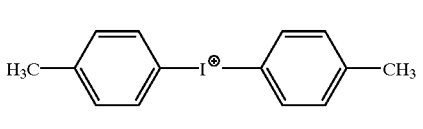

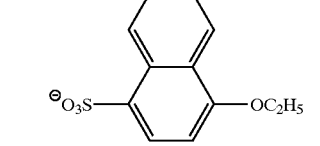

(PAG3-9)
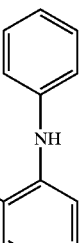

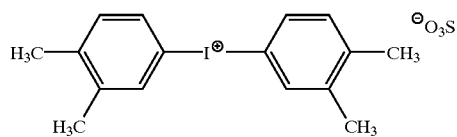

-continued
(PAG3-10)
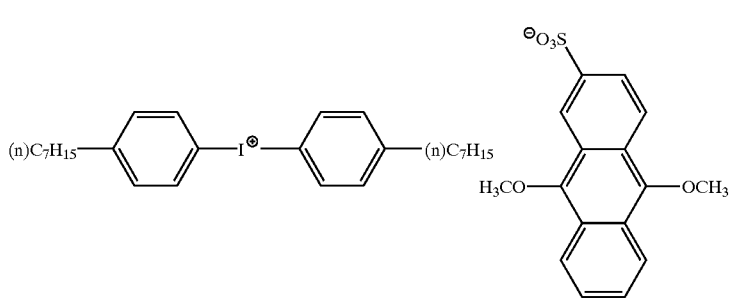
(PAG3-11)
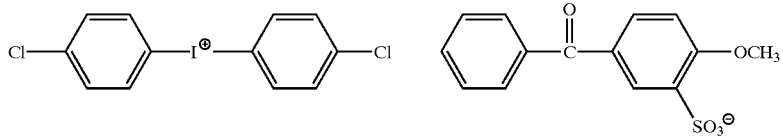
(PAG3-12) (PAG3-13)
(PAG3-14) (PAG3-15)
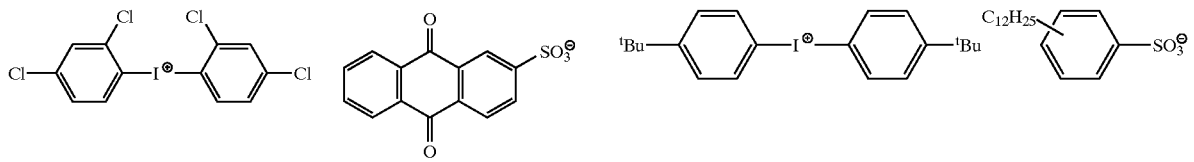
(PAG3-16) (PAG3-17)
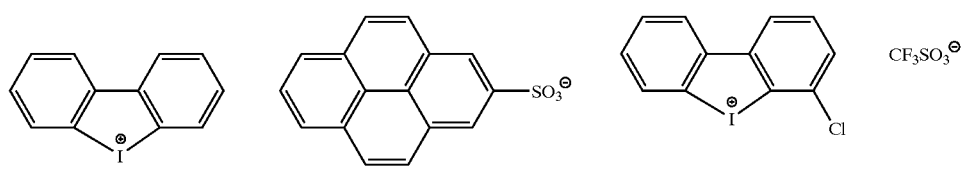
(PAG3-18)
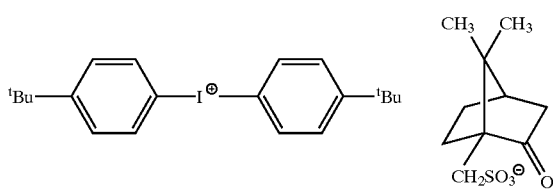
(PAG3-19)
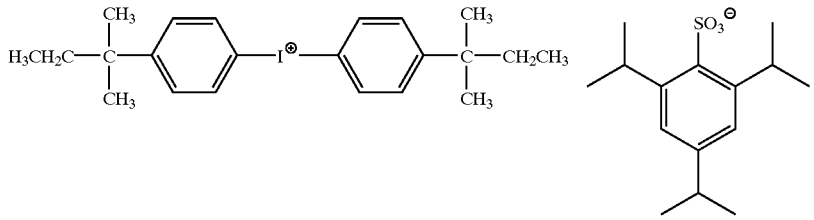
(PAG3-20) (PAG3-21)
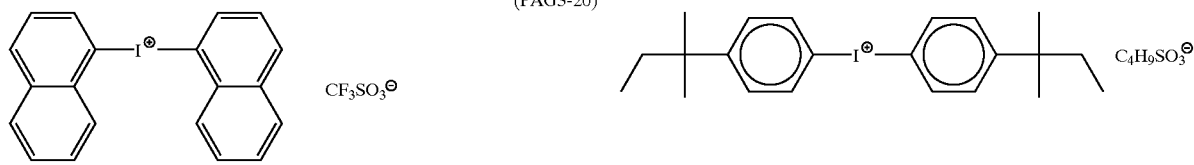

-continued
(PAG3-22)
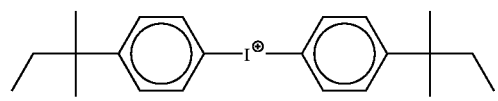
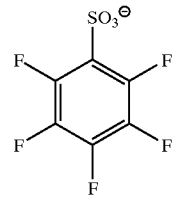
(PAG3-23)
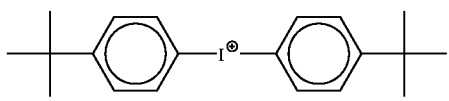
 CF$_3$SO$_3^\ominus$
(PAG3-24)
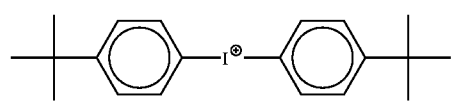
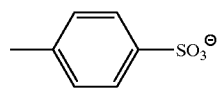
(PAG3-25)
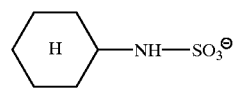
(PAG4-1)
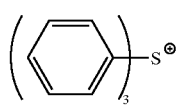 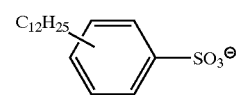
(PAG4-2)
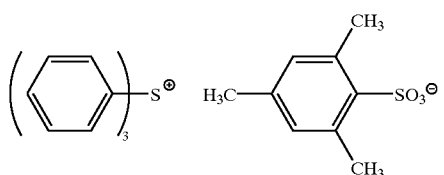
(PAG4-3)
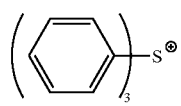 AsF$_6^\ominus$
(PAG4-4)
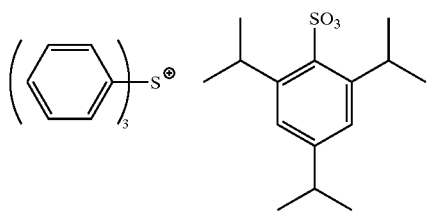
(PAG4-5)
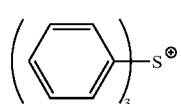 CF$_3$SO$_3^\ominus$
(PAG4-6)
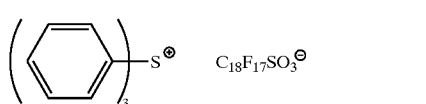 C$_{18}$F$_{17}$SO$_3^\ominus$
(PAG4-7)
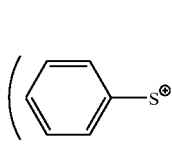 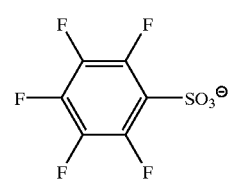
(PAG4-8)
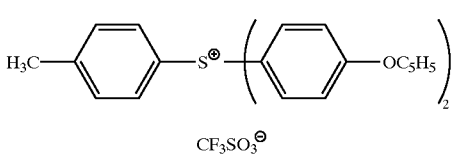
CF$_3$SO$_3^\ominus$
(PAG4-9)
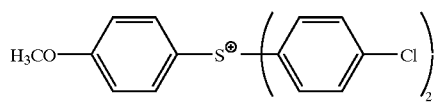 CF$_3$SO$_3^\ominus$
(PAG4-10)
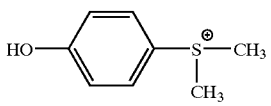 PF$_6^\ominus$
(PAG4-11)
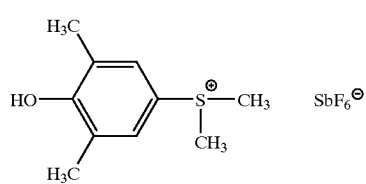 SbF$_6^\ominus$
(PAG4-12)
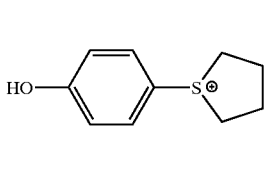

-continued
(PAG4-13)
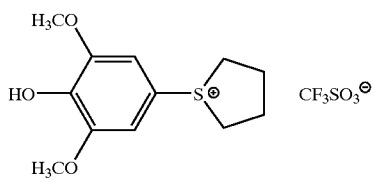
(PAG4-14)
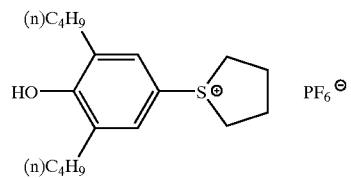
(PAG4-15)
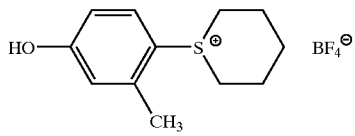
(PAG4-16)
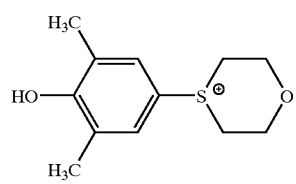 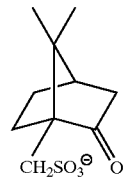
(PAG4-17)
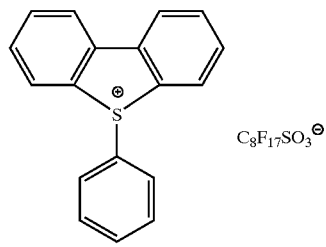
(PAG4-18)
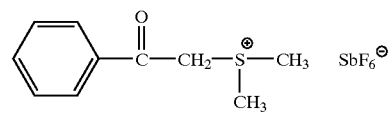
(PAG4-19)
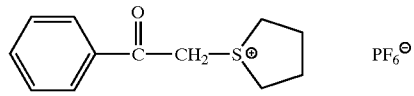
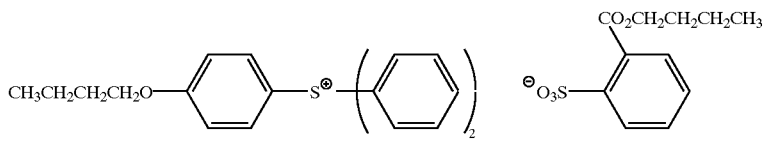
(PAG4-20)
(PAG4-21)
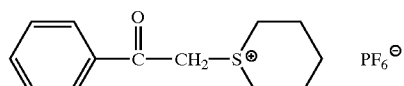
(PAG4-22)
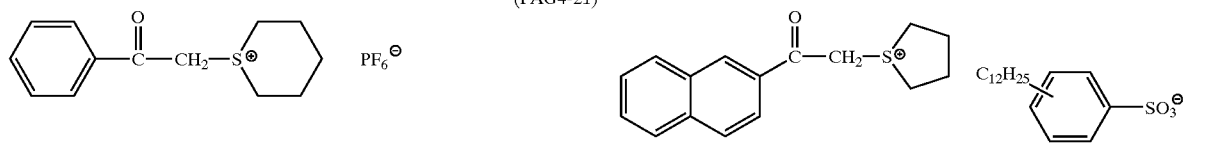
(PAG4-23)
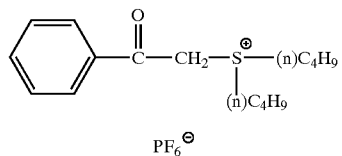
(PAG4-24)
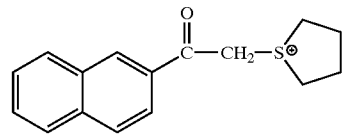
(PAG4-25)
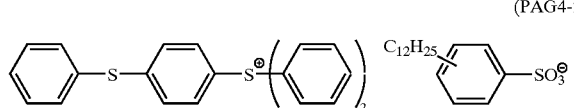 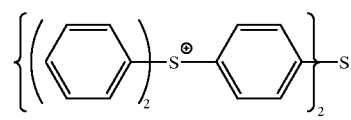
(PAG4-26)
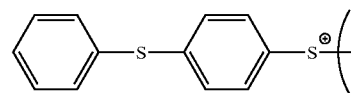
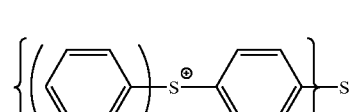
2CF$_3$SO$_3^\ominus$ -continued
(PAG4-27) 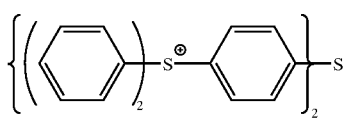
(PAG4-28) 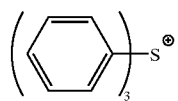
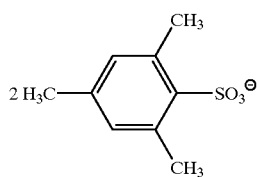
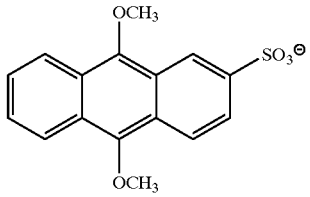
(PAG4-29) 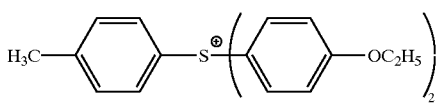
(PAG4-30) 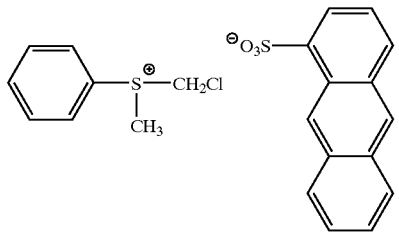
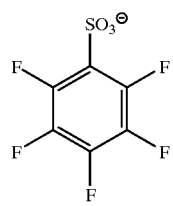
(PAG4-31) 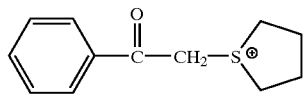
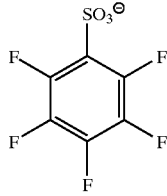
(PAG4-32) 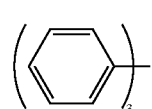
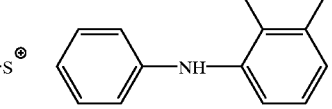
(PAG4-33) 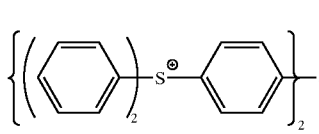
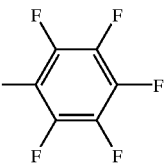
(PAG4-34) 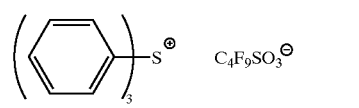
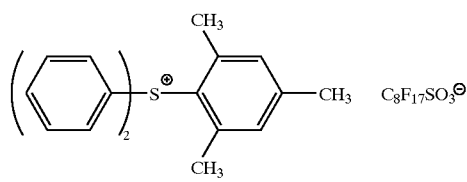
(PAG4-35)
(PAG4-36)
PAG4-37
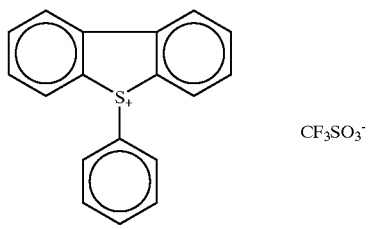
The onium salts represented by general formulas (PAG3) and (PAG4) are known, and can be synthesized, for example, by methods described in J. W. Knapczyk et al., *J. Am. Chem. Soc.*, 91, 145 (1959), A. L. Maycok et al., *J. Org. Chem.*, 35, 2532 (1970) E. Goethas et al., *Bull. Soc. Chem. Belg.*, 73, 546 (1964), H. M. Leicester, *J. Am. Chem. Soc.*, 51, 3587

(1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) or iminosulfonate derivatives represented by general formula (PAG6):

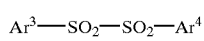
(PAG5)

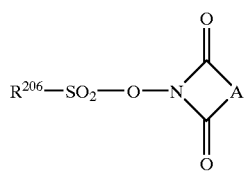
(PAG6)

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited to the following compounds:

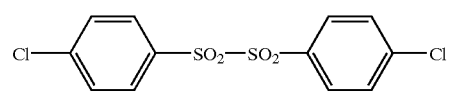
(PAG5-1)

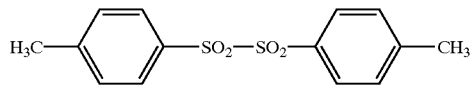
(PAG5-2)

(PAG5-3)

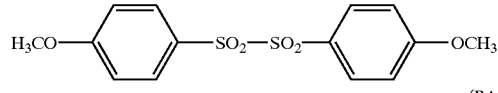
(PAG5-4)

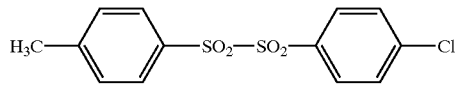
(PAG5-5)

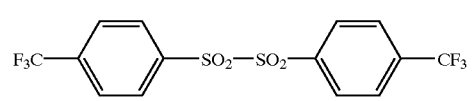
(PAG5-6)

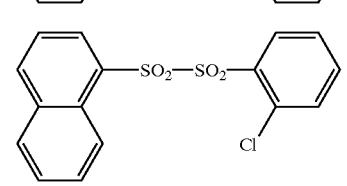
(PAG5-7)

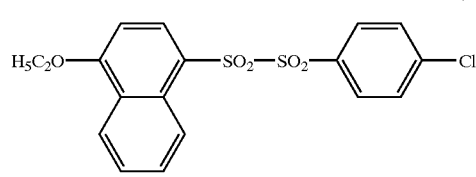
(PAG5-8)

-continued

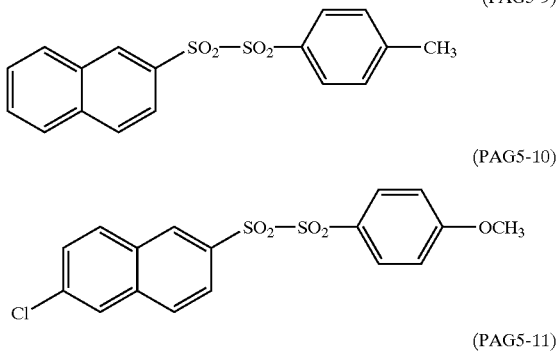
(PAG5-9)

(PAG5-10)

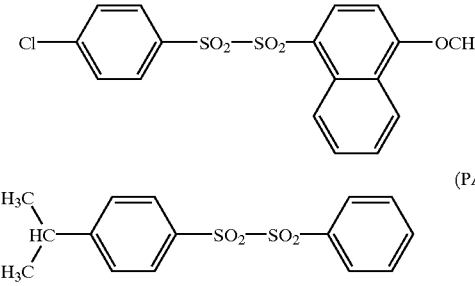
(PAG5-11)

(PAG5-12)

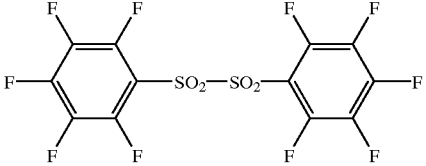
(PAG5-13)

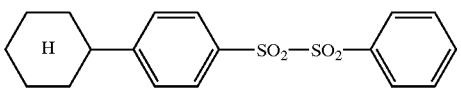
(PAG5-14)

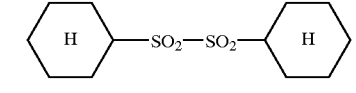
(PAG5-15)

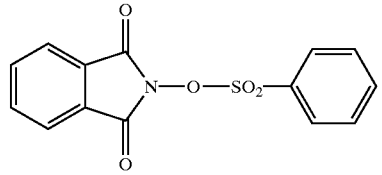
(PAG6-1)

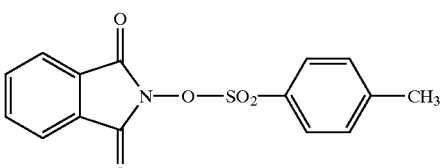
(PAG6-2)

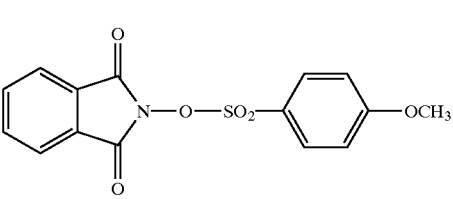
(PAG6-3)

(PAG6-4)
(PAG6-5)
(PAG6-6)
(PAG6-7)
(PAG6-8)
(PAG6-9)
(PAG6-10)
(PAG6-11)
(PAG6-12)
(PAG6-13)
(PAG6-14)
(PAG6-15)
(PAG6-16)
(PAG6-17)
(PAG6-18)
(PAG6-19)

-continued (PAG6-20)

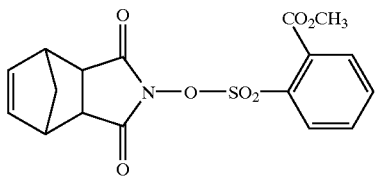

(4) Diazodisulfone derivatives represented by the following general formula (PAG7)

(PAG7)

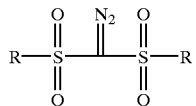

wherein R represents a straight-chain, branched or cyclic alkyl group, or an aryl group which may be substituted.

Specific examples thereof include but are not limited to the following compounds:

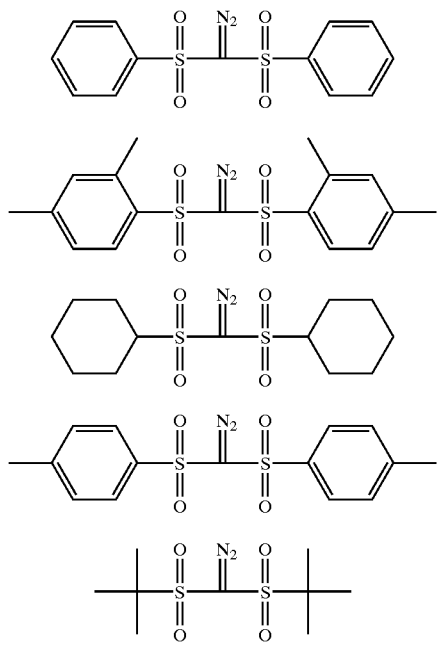

(PAG7-1)

(PAG7-2)

(PAG7-3)

(PAG7-4)

(PAG7-5)

The amount of these photoacid generators added is usually within the range of 0.001% to 40% by weight, preferably within the range of 0.01% to 20% by weight, and more preferably within the range of 0.1% to 5% by weight, based on the solid component in the composition. In case that the amount of the photoacid generators added is less than 0.001% by weight, the sensitivity is decreased. On the other hand, in case that the amount added exceeds 40% by weight, the light absorption of resists becomes too high, unfavorably resulting in deterioration of profiles and narrowing of process (particularly bake) margins.

<(ii) Resin Decomposable by Action of Acid to Increase Its Solubility in Alkali>

The above-mentioned resin (ii) used in the composition of the invention which is decomposable by action of an acid to increase its solubility in an alkali (hereinafter also briefly referred to as an alkali-soluble resin (ii)) contains repeating units of at least one kind selected from the group consisting of (a) repeating units having alkali-soluble groups each protected with at least one group selected from the group consisting of groups containing alicyclic hydrocarbon structures represented by the above-mentioned general formulas (pI) to (pVI), (b) repeating units represented by the above-mentioned general formula (II) and (c) repeating units represented by the above-mentioned general formulas (III-a) to (III-d).

In general formulas (pI) to (pVI), the alkyl groups represented by $R_{12}$ to $R_{25}$, which may be either substituted or unsubstituted, indicate straight-chain or branched alkyl groups each having 1 to 4 carbon atoms. The alkyl groups include, for example, methyl, ethyl, n-propyl, isopropyl, n-butyl, isobutyl, sec-butyl and t-butyl.

Further substituents for the above-mentioned alkyl groups include alkoxy having 1 to 4 carbon atoms, halogen (fluorine, chlorine, bromine and iodine), acyl, acyloxy, cyano, hydroxyl, carboxyl, alkoxycarbonyl and nitro.

The alicyclic hydrocarbon groups represented by $R_{11}$ to $R_{25}$ or the alicyclic hydrocarbon groups formed by Z and a carbon atom may be either monocyclic or polycyclic. Specifically, they include groups each having a monocyclic, bicyclic, tricyclic or tetracyclic structure having 5 of more carbon atoms. The carbon number thereof is preferably from 6 to 30, and particularly preferably from 7 to 25. These alicyclic hydrocarbon groups may have substituents.

Structure examples of alicyclic moieties of the groups containing the alicyclic hydrocarbon structures are shown below:

(1)

(2)

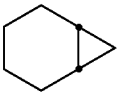

(3)

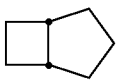

(4)

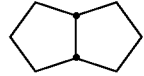

(5)

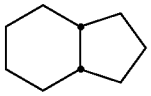

(6)

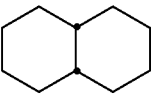

(7)

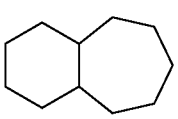

(8)

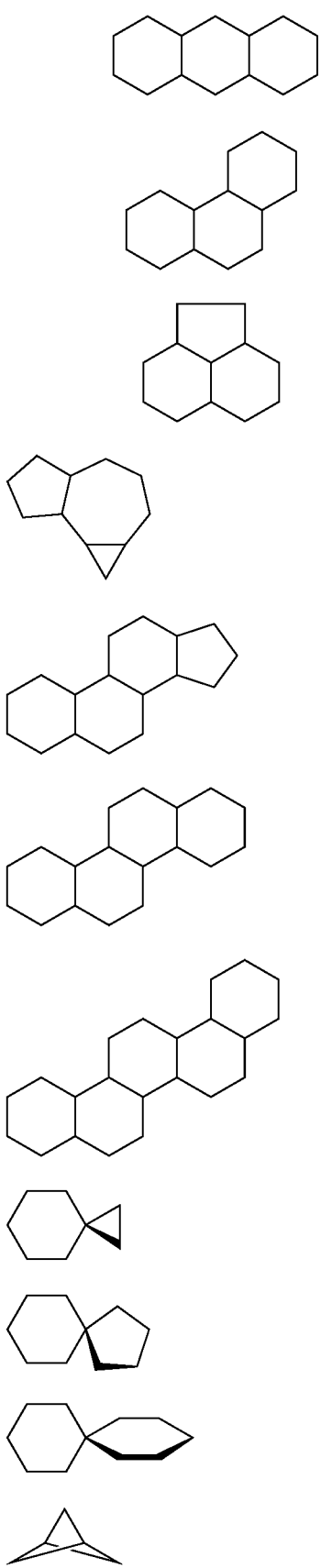
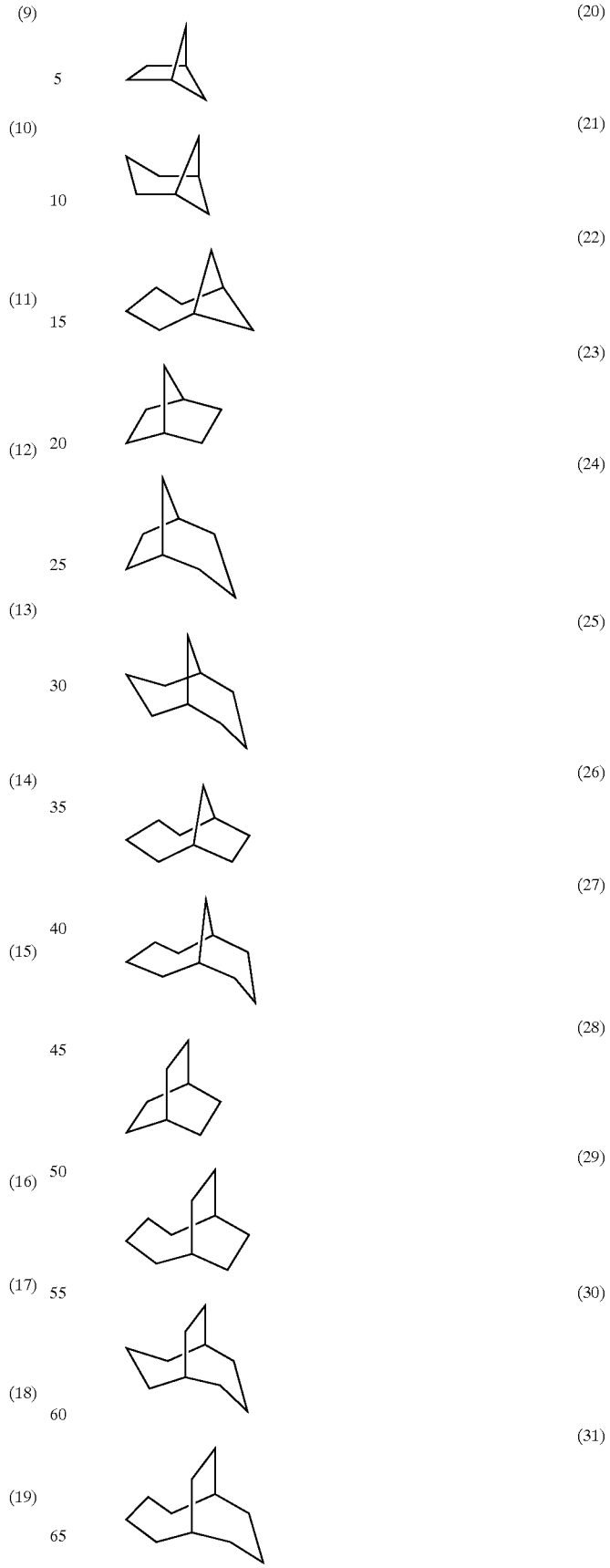

(32) 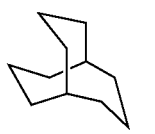

(33) 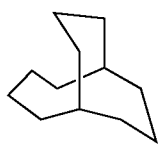

(34) 

(35) 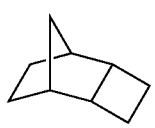

(36) 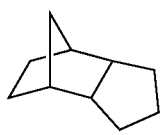

(37) 

(38) 

(39) 

(40) 

(41) 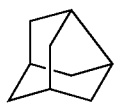

(42) 

(43) 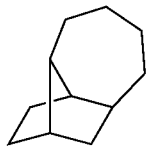

(44) 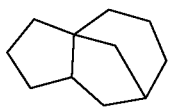

(45) 

(46) 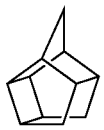

(47) 

(48) 

(49) 

(50) 

In the invention, preferred examples of the alicyclic moieties include adamantyl, noradamantyl, decalin residues, tricyclodecanyl, tetracyclododecanyl, norbornyl, cedrol, cyclohexyl, cycloheptyl, cyclooctyl, cyclodecanyl and cyclododecanyl. More preferred are adamantyl, decalin residues, norbornyl, cedrol, cyclohexyl, cycloheptyl, cyclooctyl. cyclodecanyl and cyclododecanyl.

Substituents for these alicyclic hydrocarbon groups include alkyl, substituted alkyl, halogen, hydroxyl, alkoxy, carboxyl and alkoxycarbonyl. As the alkyl groups, lower alkyl groups such as methyl, ethyl, propyl, isopropyl and butyl are preferred, and more preferred are methyl, ethyl, propyl and isopropyl.

Substituents for the substituted alkyl groups include hydroxyl, halogen and alkoxy. The alkoxy groups include ones each having 1 to 4 carbon atoms such as methoxy, ethoxy, propoxy and butoxy.

The alkali-soluble groups protected with the structures represented by general formulas (pI) to (pVI) in the above-mentioned alkali-soluble resins (ii) include various groups known in the art. Specifically, they include carboxylic acid, sulfonic acid, phenol and thiol groups, and preferred are carboxylic acid and sulfonic acid groups.

The alkali-soluble groups protected with the structures represented by general formulas (pI) to (pVI) in the resins preferably include groups represented by the following general formulas (pVII) to (pXI):

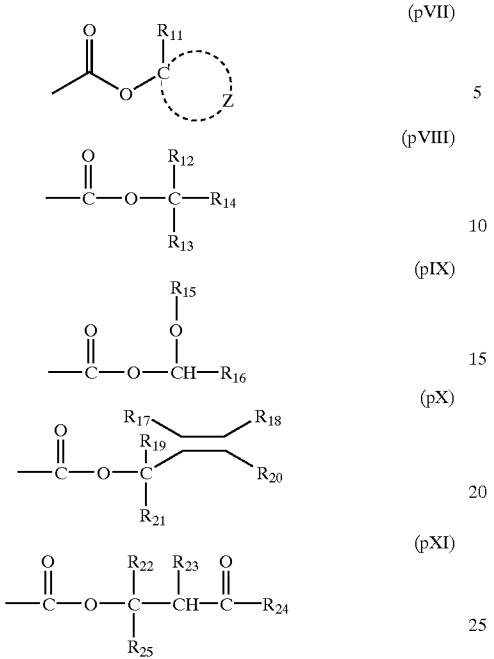

wherein $R_{11}$ to $R_{25}$ and Z have the same meanings as given above, respectively.

As the repeating units (a) constituting the alkali-soluble resins (ii) and having the alkali-soluble groups protected with the structures represented by general formulas (pI) to (pVI), repeating units represented by the following general formula (pA) are preferred:

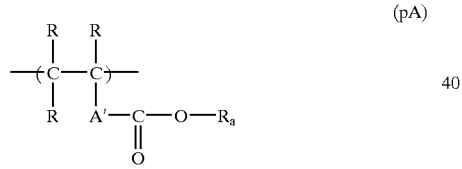

wherein R represents a hydrogen atom, a halogen atom or a substituted or unsubstituted, straight-chain or branched alkyl group having 1 to 4 carbon atoms, and a plurality of Rs may be the same or different; A' represents a single group or a combination of two or more groups selected from the group consisting of a single bond, an alkylene group, a substituted alkylene group, an ether group, a thioether group, a carbonyl group, an ester group, an amido group, a sulfonamido group, a urethane group and a urea group; and Ra represents any one of the groups of formulas (pI) to (pVI) described above.

Specific examples of monomers corresponding to the repeating units represented by general formula (pA) are shown below:

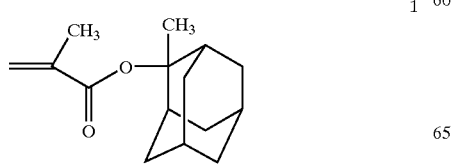

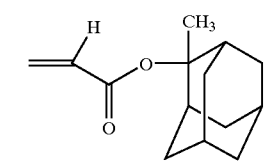

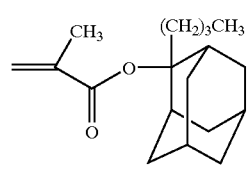

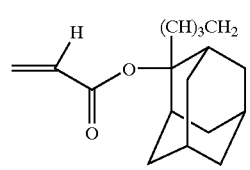

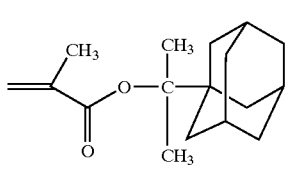

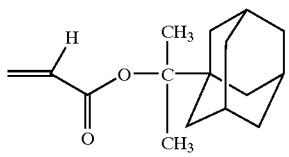

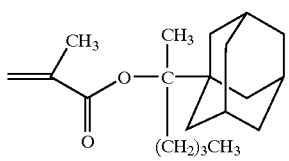

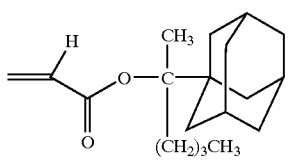

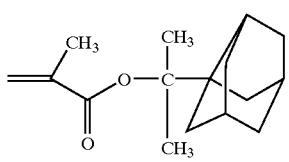

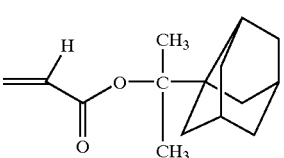

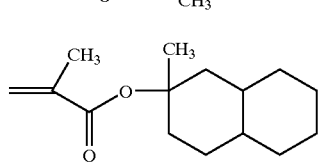

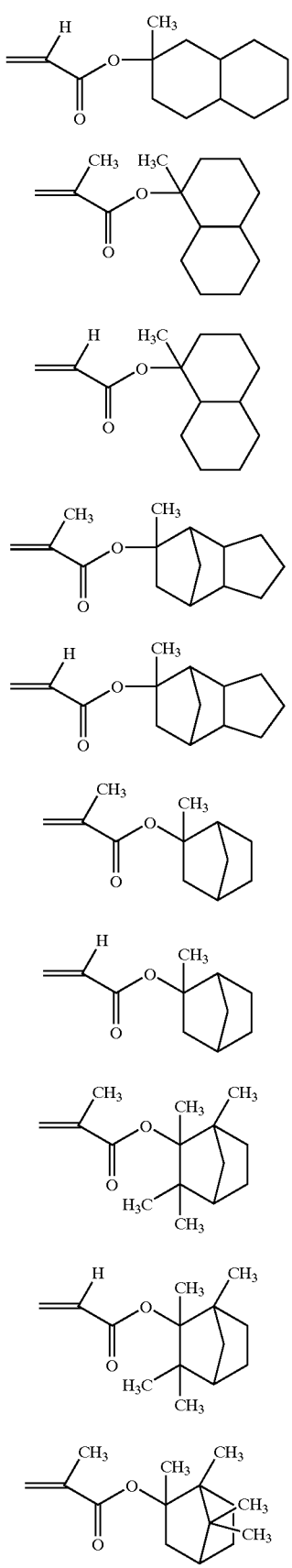
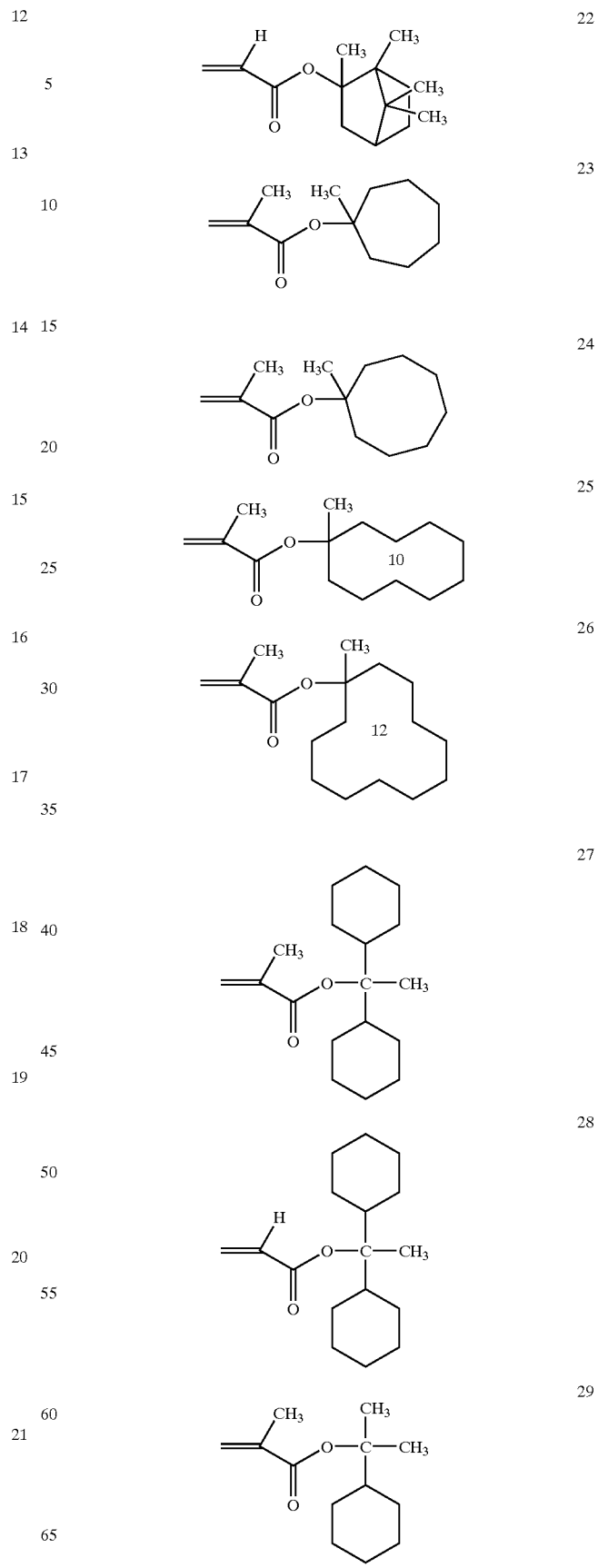

-continued

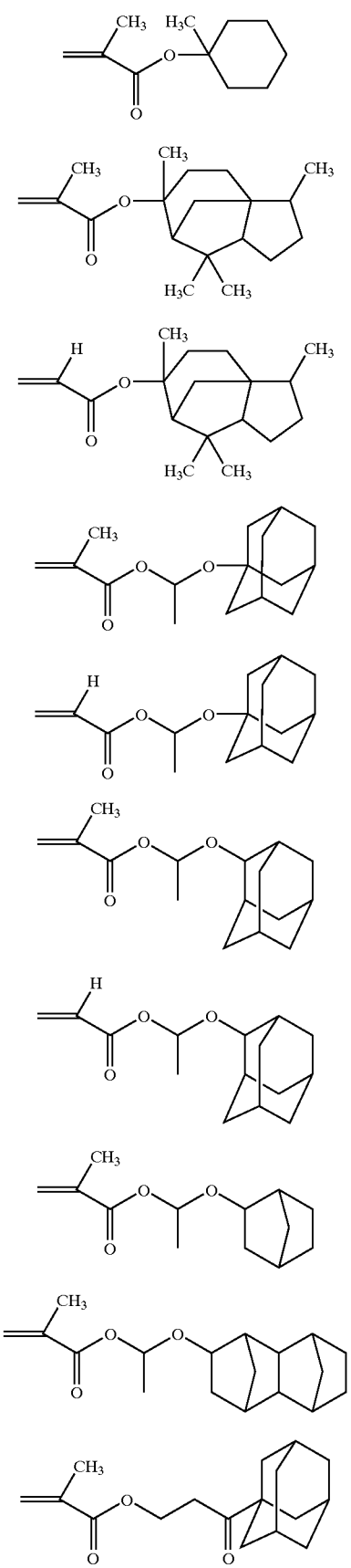

-continued

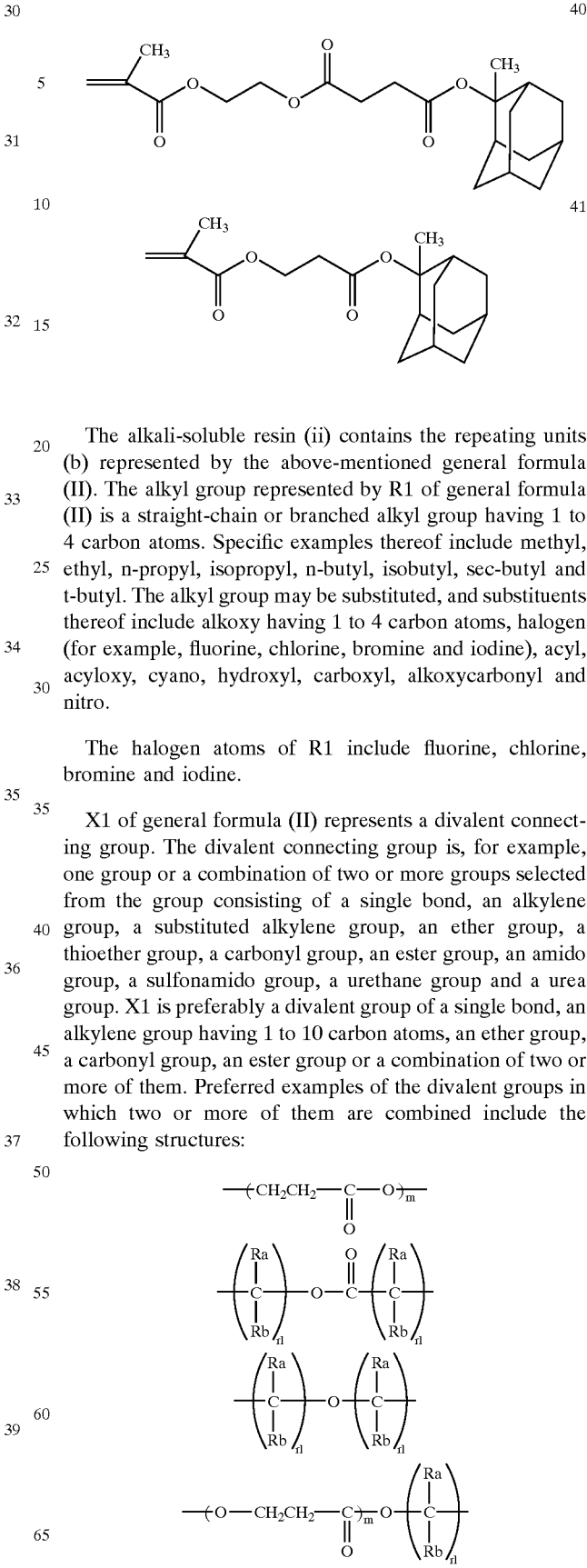

The alkali-soluble resin (ii) contains the repeating units (b) represented by the above-mentioned general formula (II). The alkyl group represented by R1 of general formula (II) is a straight-chain or branched alkyl group having 1 to 4 carbon atoms. Specific examples thereof include methyl, ethyl, n-propyl, isopropyl, n-butyl, isobutyl, sec-butyl and t-butyl. The alkyl group may be substituted, and substituents thereof include alkoxy having 1 to 4 carbon atoms, halogen (for example, fluorine, chlorine, bromine and iodine), acyl, acyloxy, cyano, hydroxyl, carboxyl, alkoxycarbonyl and nitro.

The halogen atoms of R1 include fluorine, chlorine, bromine and iodine.

X1 of general formula (II) represents a divalent connecting group. The divalent connecting group is, for example, one group or a combination of two or more groups selected from the group consisting of a single bond, an alkylene group, a substituted alkylene group, an ether group, a thioether group, a carbonyl group, an ester group, an amido group, a sulfonamido group, a urethane group and a urea group. X1 is preferably a divalent group of a single bond, an alkylene group having 1 to 10 carbon atoms, an ether group, a carbonyl group, an ester group or a combination of two or more of them. Preferred examples of the divalent groups in which two or more of them are combined include the following structures:

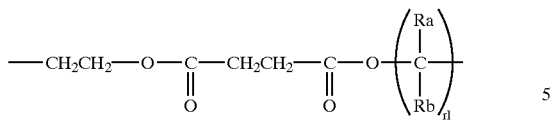

wherein Ra and Rb each independently represents a hydrogen atom, an alkyl group, a substituted alkyl group, a halogen atom, a hydroxyl group or an alkoxy group. The alkyl groups are preferably lower alkyl groups such as methyl, ethyl, propyl, isopropyl and butyl, and more preferably, they are selected from methyl, ethyl, propyl and isopropyl. Substituents for the substituted alkyl groups include hydroxyl, halogen and alkoxy. The alkoxy groups include ones each having 1 to 4 carbon atoms such as methoxy, ethoxy, propoxy and butoxy. The halogen atoms include chlorine, bromine, fluorine and iodine. r1 represents an integer of 1 to 10, and m indicates an integer of 1 to 3.

In general formula (II), Lc represents a lactone group. Specific groups of the lactone groups are shown below, but are not limited thereto.

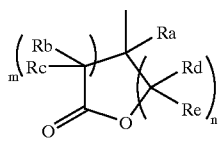

In the lactone group described above, Ra, Rb, Rc and Rd each independently represents a hydrogen atom or a straight-chain or branched alkyl group having 1 to 4 carbon atoms, which may have a substituent, m and n each independently represents an integer of 0 to 3, and m+n is from 2 to 6.

Specific examples of the repeating units represented by general formula (II) described above are enumerated below:

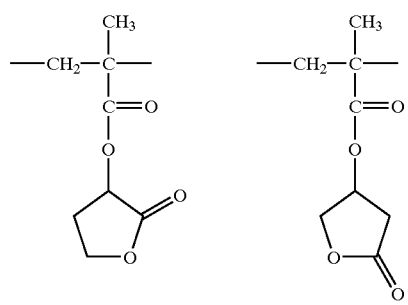

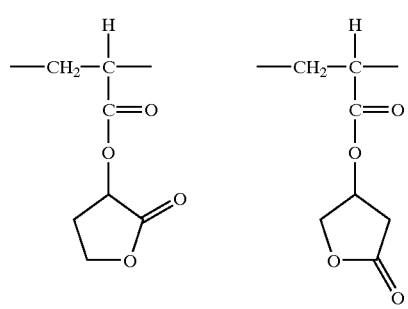

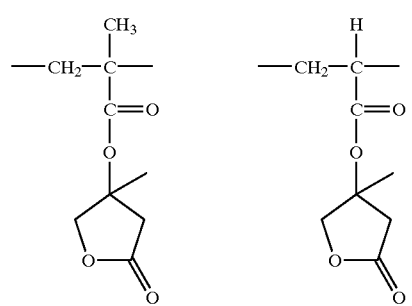

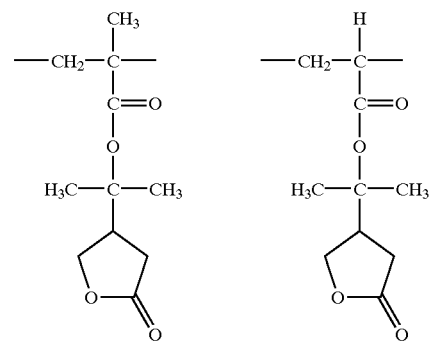

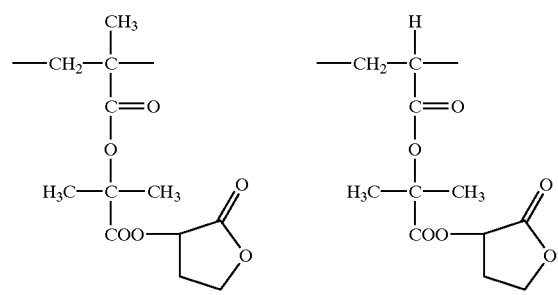

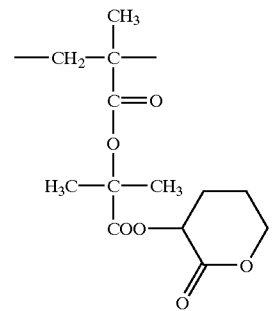

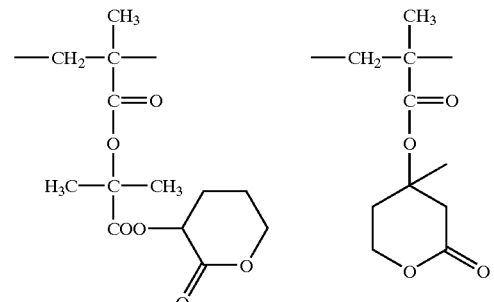

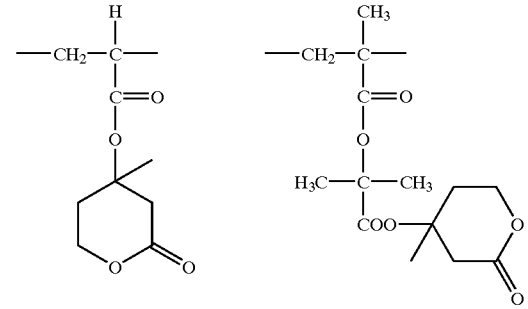

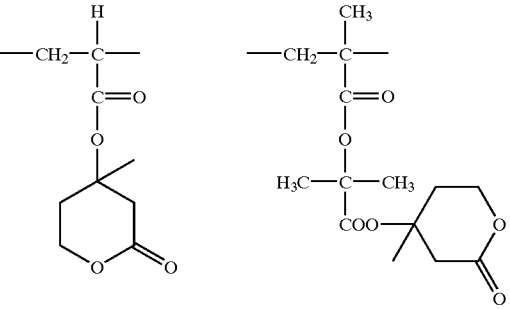

-continued

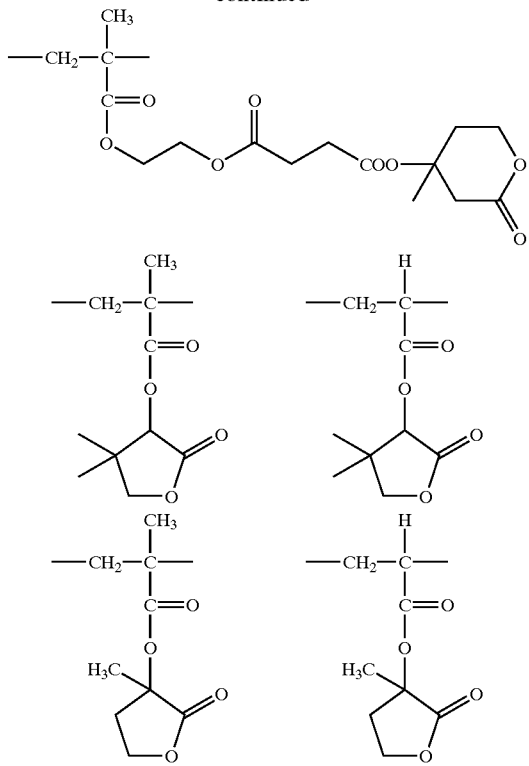

In general formulas (III-a) to (III-d), R1 has the same meaning as given above.

The alkyl groups represented by R30 to R37, R, R39 and R41 include straight-chain or branched alkyl groups, which may have substituents. As the straight-chain or branched alkyl groups, straight-chain or branched alkyl groups having 1 to 12 carbon atoms are preferred, straight-chain or branched alkyl groups having 1 to 10 carbon atoms are more preferred, and methyl, ethyl, propyl, isopropyl, n-butyl, isobutyl, sec-butyl, t-butyl, pentyl, hexyl, heptyl, octyl, nonyl and decyl are still more preferred.

The cyclic alkyl groups represented by R, R39 and R41 include ones each having 3 to 30 carbon atoms, and examples thereof include cyclopropyl, cyclopentyl, cyclohexyl, adamantyl, norbornyl, boronyl, tricyclodecanyl, dicyclopentenyl, norbornaneepoxy, menthyl, isomenthyl, neomenthyl, tetracyclododecanyl and steroid residues.

The aryl groups represented by R, R39 and R41 include ones each having 6 to 20 carbon atoms, which may have substituents. Examples thereof include phenyl, tolyl and naphthyl.

The aralkyl groups represented by R, R39 and R41 include ones each having 7 to 20 carbon atoms, which may have substituents. Examples thereof include benzyl, phenethyl and cumyl.

The alkenyl groups represented by R41 include alkenyl groups each having 2 to 6 carbon atoms, and examples thereof include vinyl, propenyl, allyl, butenyl, pentenyl, hexenyl, cyclopentenyl, cyclohexenyl, 3-oxocyclohexenyl, 3-oxocyclopentenyl and 3-oxoindenyl. Of these, the cyclic alkenyl groups may contain oxygen atoms.

The connecting group represented by X2 is a divalent group selected from the group consisting of an alkylene group, a cyclic alkylene group, an arylene group, an ether group, a thioether group, a carbonyl group, an ester group, an amido group, a sulfonamido group, a urethane group and a urea group, which may have substituents, may be used alone or as a combination of two or more of them, and are not decomposed by the action of an acid.

Z1 represents a single bond, an ether group, an ester group, an amido group, an alkylene group or a divalent group in which they are combined; R38 represents a single bond, an alkylene group, an arylene group or a divalent group in which they are combined; R40 represents an alkylene group, an arylene group or a divalent group in which they are combined. The arylene groups represented by X2, R38 and R40 include ones each having 6 to 10 carbon atoms, which may have substituents. Examples thereof include phenylene, tolylene and naphthylene.

The cyclic alkylene groups represented by X2 include divalent ones of the cyclic alkyl groups described above.

The alkylene groups represented by X2, Z1, R38 and R40 include groups represented by the following formula:

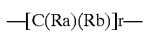

wherein Ra and Rb, which may be the same or different, each represents a hydrogen atom, an alkyl group, a substituted alkyl group, a halogen atom, a hydroxyl group or an alkoxy group. The alkyl groups are preferably lower alkyl groups such as methyl, ethyl, propyl, isopropyl and butyl, and more preferably, they are selected from methyl, ethyl, propyl and isopropyl. Substituents for the substituted alkyl groups include hydroxyl, halogen and alkoxy. The alkoxy groups include ones each having 1 to 4 carbon atoms such as methoxy, ethoxy, propoxy and butoxy. The halogen atoms include chlorine, bromine, fluorine and iodine. r represents an integer of 1 to 10.

Specific examples of the connecting groups represented by X2 are shown below, which are, however, not to be construed as limiting the scope of the invention.

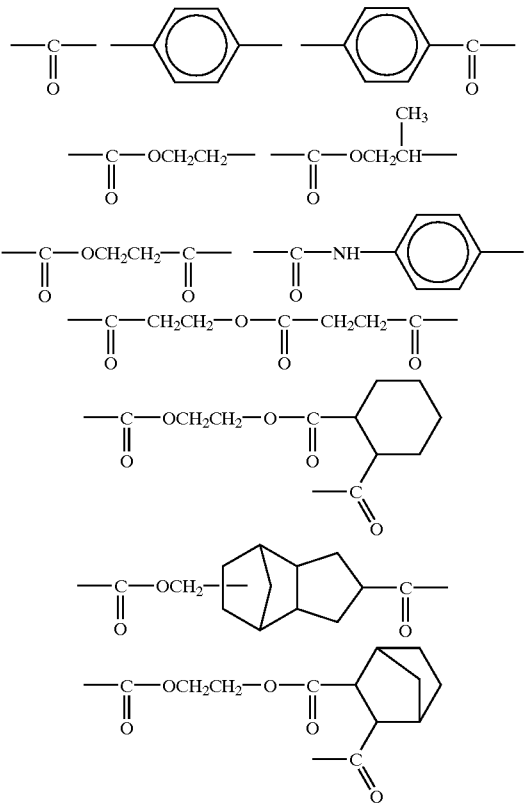

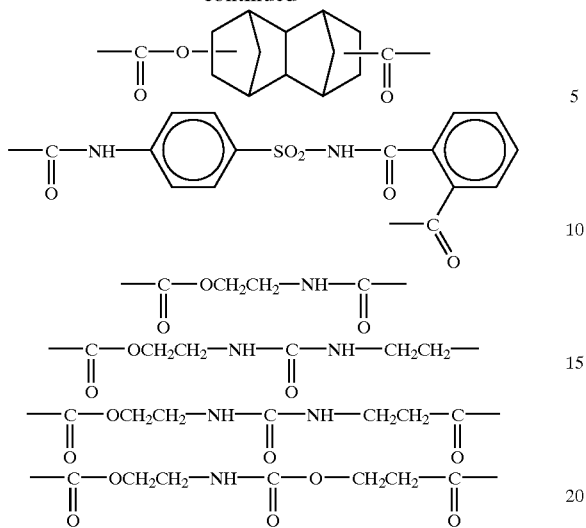

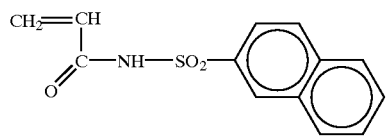
(1)

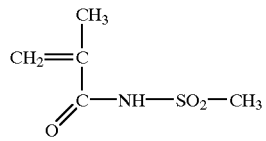
(2)

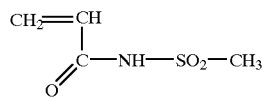
(3)

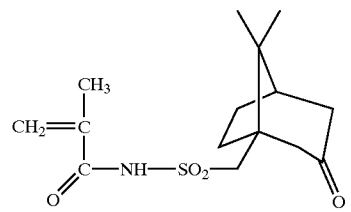
(4)

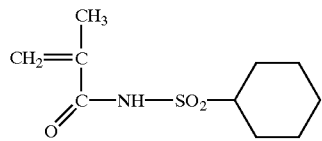
(5)

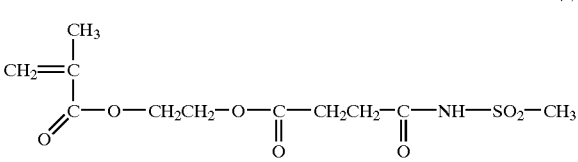
(6)

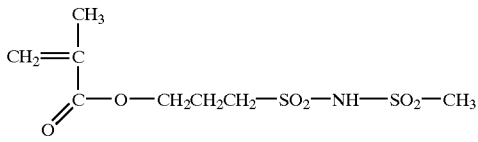
(7)

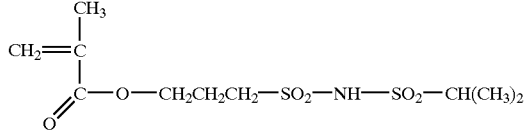
(8)

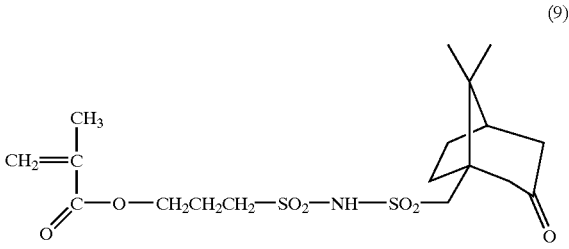
(9)

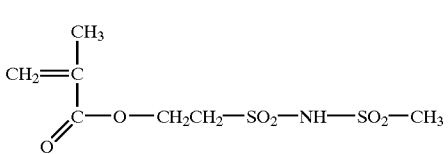
(10)

Further substituents for the above-mentioned alkyl, cyclic alkyl, alkenyl, aryl, aralkyl, alkylene, cyclic alkylene and arylene groups include carboxyl, acyloxy, cyano, alkyl, substituted alkyl, halogen, hydroxyl, alkoxy, acetylamido, alkoxycarbonyl and acyl. The alkyl groups include lower alkyl groups such as methyl, ethyl, propyl, isopropyl, butyl, cyclopropyl, cyclobutyl and cyclopentyl. Substituents for the substituted alkyl groups include hydroxyl, halogen and alkoxy. The alkoxy groups include ones each having 1 to 4 carbon atoms such as methoxy, ethoxy, propoxy and butoxy. The acyloxy groups include acetoxy. The halogen atoms include chlorine, bromine, fluorine and iodine.

As specific examples of the structures of the side chains in general formula (III-b), specific examples of the terminal structures excluding X2 are shown below, which are, however, not to be construed as limiting the scope of the invention.

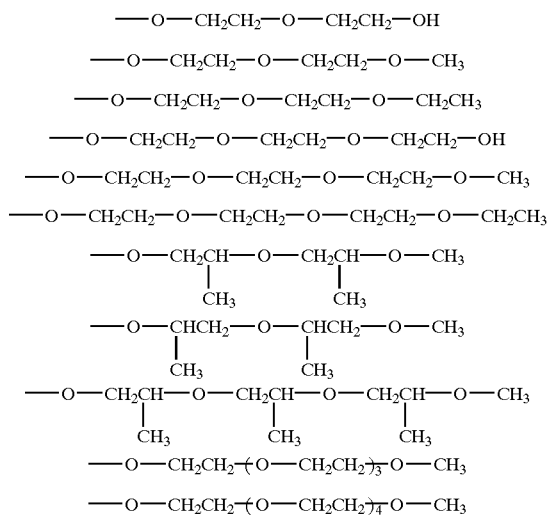

Specific examples of monomers corresponding to the repeating structure units represented by general formula (III-c) are shown below, which are, however, not to be construed as limiting the scope of the invention.

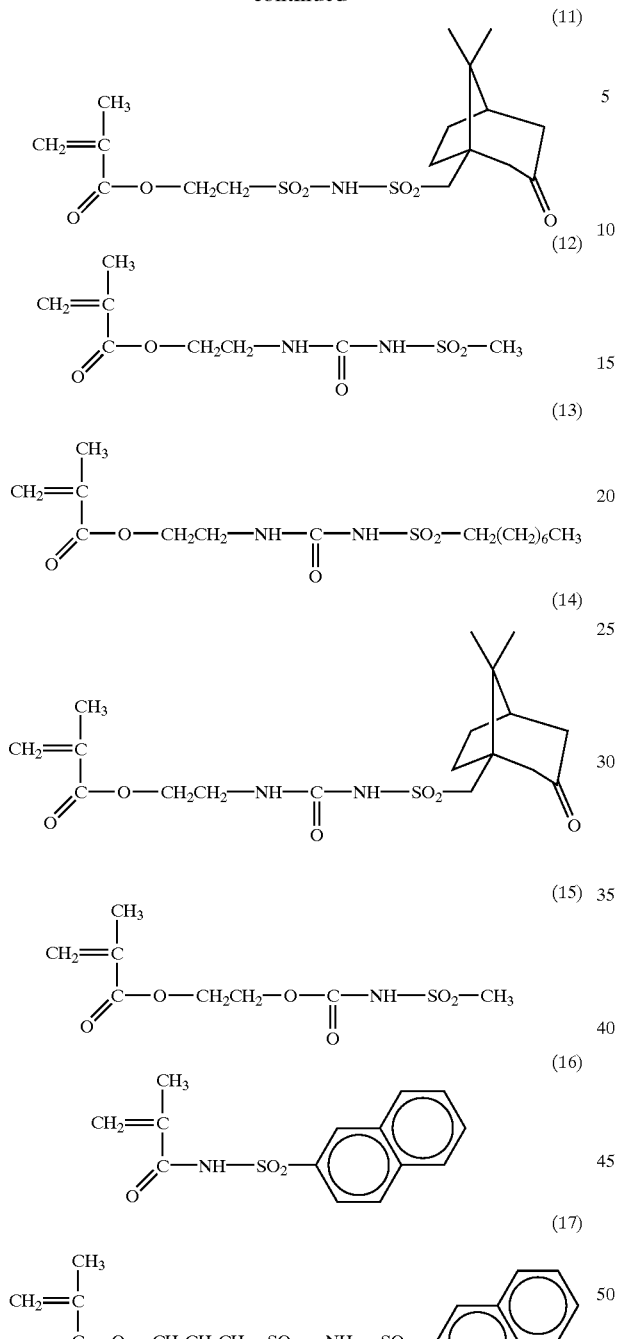
Specific examples of the repeating structure units represented by general formula (III-d) are shown below, which are, however, not to be construed as limiting the scope of the invention.
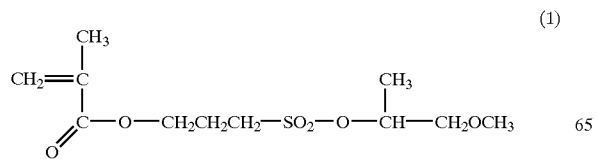
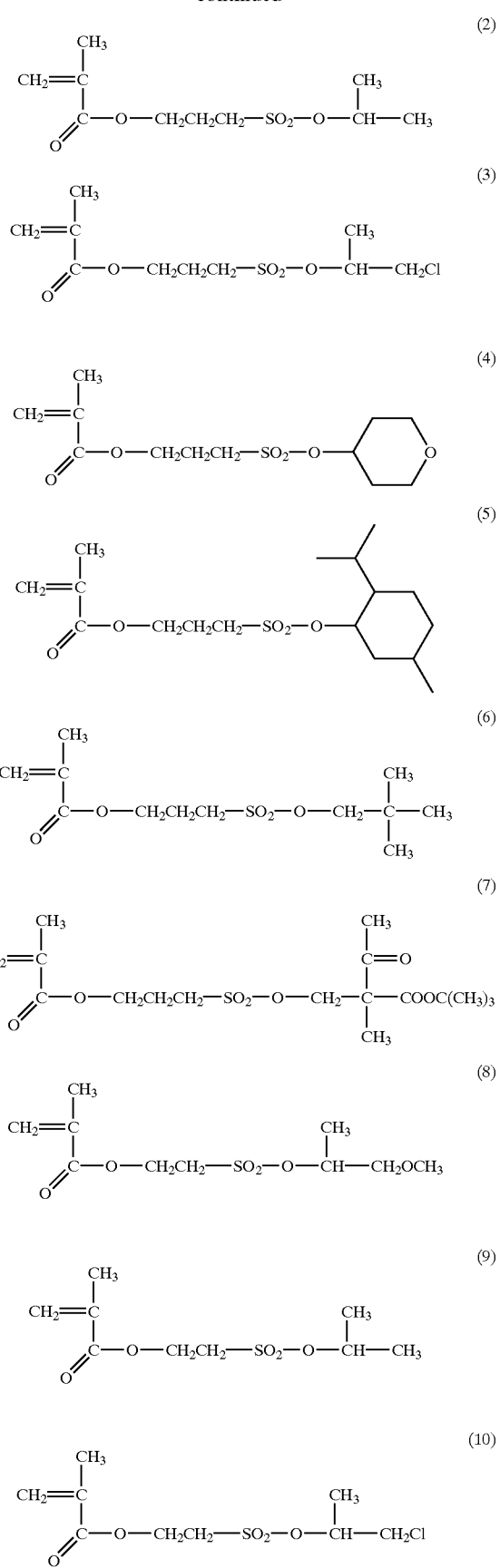

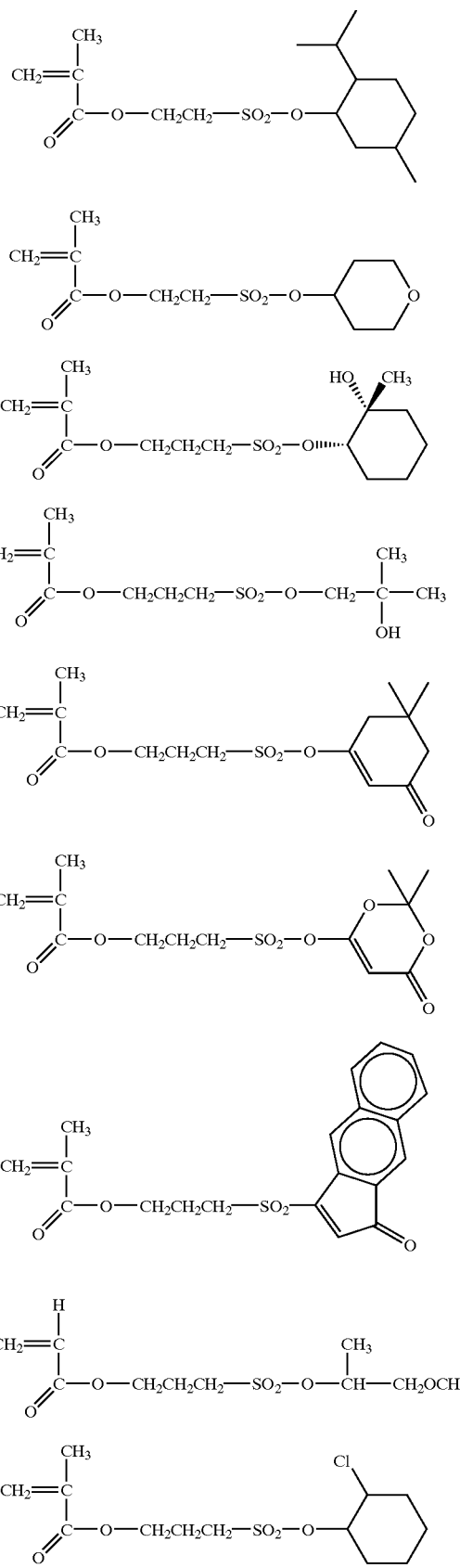

In general formula (III-b), R30 to R37 are preferably hydrogen atoms or methyl groups. R is preferably a hydrogen atom or an alkyl group having 1 to 4 carbon atoms. m is preferably an integer of 1 to 6.

In general formula (III-c), R38 is preferably a single bond or an alkylene group such as methylene, ethylene, propylene or butylene, and R39 is preferably an alkyl group having 1 to 10 carbon atoms such as methyl or ethyl, a cyclic alkyl group such as cyclopropyl, cyclohexyl or a camphor residue, a naphthyl group or a naphthylmethyl group. Z1 is preferably a single bond, an ether group, an ester group, an alkylene group having 1 to 6 carbon atoms or a combination thereof, and more preferably a single bond or an ester group.

In general formula (III-d), R40 is preferably an alkylene group having 1 to 4 carbon atoms. R41 is preferably an alkyl groups having 1 to 8 carbon atoms such as methyl, ethyl, propyl, isopropyl, butyl, neopentyl or octyl, which may have a substituent; cyclohexyl, adamantyl, norbornyl, boronyl, isoboronyl, menthyl, morpholino or 4-oxocyclohexyl; or phenyl, tolyl, mesityl, naphthyl of a camphor residue, which may have a substituent. As further substituents for these, halogen atoms such as fluorine and alkoxy groups each having 1 to 4 carbon atoms are preferred.

In the invention, of the repeating units represented by general formulas (III-a) to (III-d), the repeating units represented by general formulas (III-b) and (III-d) are preferred.

The alkali-soluble resins (ii) may contain repeating units other than (a), (b) and (c)

In the alkali-soluble resins (ii), the molar ratio of the respective repeating units contained is appropriately established for controlling the acid value, the dry etching resistance of resists, the standard developing solution suitability, the adhesion to substrates, the iso-dense vias of resist profiles, and further, the resolving power, heat resistance and sensitivity generally required for resists.

In the alkali-soluble resins (ii), the content of the repeating structural units (a) having the alkali-soluble groups protected with the structures represented by general formulas (pI) to (pVI) is preferably from 20 mol % to 70 mol %, more preferably from 25 mol % to 65 mol %, and still more preferably, from 30 mol % to 60 mol %, based on the total repeating units. The excessive existence of the repeating units (a) results in the difficulty of image formation, whereas too little the existence thereof deteriorates the dry etching resistance.

The content of the repeating structural units (b) represented by general formula (II) is preferably from 20 mol % to 70 mol %, more preferably from 25 mol % to 65 mol %, and still more preferably from 30 mol % to 60 mol %, based on the total repeating units. The excessive existence of the repeating units (b) deteriorates the dry etching resistance, whereas too little the existence thereof results in the difficulty of image formation.

The content of the repeating structural units (c) represented by general formulas (III-a) to (III-d). is from 0.1 mol % to 20 mol %, more preferably from 0.3 mol % to :18 mol %, and more preferably from 0.5 mol % to 16 mol %, based on the total repeating units. In case that the repeating units (c) exist in an amount exceeding 20 mol %, the film thickness loss in resists after exposure and development arises to an appreciable degree in the positive-working photoresist compositions of the invention. On the other hand, less than 0.1 mol % unfavorably results in generation of the iso-dense vias of resists.

The weight-average molecular weight Mw of the alkali-soluble resins (ii) ranges preferably from 1,000 to 1,000,000, more preferably from 1,500 to 500,000, still more preferably from 2,000 to 200,000, and particularly preferably from 2,500 to 100,000 as a value measured by gel permeation chromatography, in terms of standard polystyrene. A higher weight-average molecular weight results in more improved heat resistance, whereas results in lower development properties. It is therefore adjusted to the preferred range according to the balance of these.

The alkali-soluble resins (ii) used in the invention can be synthesized by conventional processes, for example, radical polymerization.

In the positive-working photoresist compositions for far ultraviolet ray exposure of the invention, the amount of the alkali-soluble resins (ii) added to the entire compositions is preferably from 40% to 99.99% by weight, and more preferably from 50% to 99.97% by weight, based on the total solid content of resist.

In the invention, as another embodiment, the alkali-soluble resin (ii) is preferably a resin containing repeating units of at least one kind selected from the group consisting of repeating units represented by general formula (I'), repeating units represented by general formula (II') and repeating units represented by general formulas (III-a) to (III-d), and increased in the rate of dissolution into an alkali developing solution by the action of an acid.

In the invention, the alkali-soluble resins can be used as copolymers with various monomer repeating units in addition to the above-mentioned repeating units for controlling the dry etching resistance, the standard developing solution suitability, the adhesion to substrates, the resist profiles, land further, requirements generally necessary for resists, the resolving power, the heat resistance and the sensitivity.

Such repeating units include but are not limited to repeating units corresponding to monomers as shown below.

This enables fine adjustment of properties required for the above-mentioned resins, particularly (1) the solubility in coating solvents, (2) the film forming properties (glass transition temperature), (3) the alkali developing properties, (4) the film thickness loss (hydrophilic and hydrophobic properties, selection of alkali-soluble groups), (5) the adhesion of unexposed areas to substrates and (6) the dry etching resistance.

Such monomers for copolymerization include, for example, compounds each having one addition-polymerizable unsaturated bond, selected from acrylic esters, methacrylic esters, acrylamide compounds, methacrylamide compounds, allyl compounds, vinyl ethers and vinyl esters.

Specifically, examples of the acrylic esters include alkyl acrylates (wherein alkyl groups each preferably has 1 to 10 carbon atoms) such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimetylhydroxypropyl, acrylate, 5-hydroxypentyl acrylate trimethylolpropane monoacrylate, pentaerythritol monoacrylate, benzyl acrylate, methoxybenzyl acrylate, furfuryl acrylate and tetrahydrofurfuryl acrylate.

Examples of the methacrylic esters include alkyl methacrylates (wherein alkyl groups each preferably has 1 to 10 carbon atoms) such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate.

Examples of the acrylamide compounds include acrylamide, N-alkylacrylamides (wherein alkyl groups each has 1 to 10 carbon atoms, for example, methyl, ethyl, propyl, butyl, t-butyl, heptyl, octyl, cyclohexyl and hydroxyethyl), N,N-dialkylacrylamides (wherein alkyl groups each has 1 to 10 carbon atoms, for example, methyl, ethyl, butyl, isobutyl, ethylhexyl and cyclohexyl), N-hydroxyethyl-N-methylacrylamide and N-2-acetamidoethyl-N-acetylacrylamide.

Examples of the methacrylamide compounds include methacrylamide, N-alkylmethacrylamides (wherein alkyl groups each has 1 to 10 carbon atoms, for example, methyl, ethyl, t-butyl, ethylhexyl, hydroxyethyl and cyclohexyl), N,N-dialkylmethacrylamides (wherein alkyl groups are, for example, ethyl, propyl and butyl) and N-hydroxyethyl-N-methylmethacrylamide.

Examples of the allyl compounds include allyl esters (such as allyl acetate, allyl caproate, allyl caprylate, allyl laurate, allyl palmitate, allyl stearate, allyl benzoate, allyl acetoacetate and allyl lactate) and allyloxyethanol.

Examples of the vinyl ethers include alkyl vinyl ethers such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether.

Examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate.

The monomers also include dialkyl itaconates (such as dimethyl itaconate, diethyl itaconate and dibutyl itaconate), dialkyl esters of fumaric acid (such as dibutyl fumarate) and monoalkyl esters thereof, crotonic acid, itaconic acid, maleic anhydride, maleimide, acrylonitrile, methacrylonitrile and maleylonitrile.

In addition, any monomers may be used, as long as they are addition-polymerizable unsaturated compounds copolymerizable with the above-mentioned various repeating units.

In the alkali-soluble resins, the molar ratio of the respective repeating units contained is appropriately established for controlling the dry etching resistance of resists, the standard developing solution suitability, the adhesion to substrates, the resist profiles, and further, requirements generally necessary for resists, the resolving power, the heat resistance and the sensitivity.

In the alkali-soluble resins, the content of the repeating units represented by general formula (I') is preferably from 30 mol % to 80 mol %, more preferably from 32 mol % to 75 mol %, and still more preferably from 35 mol % to 70 mol %, based on the total monomer repeating units.

In the alkali-soluble resins, the content of the repeating units represented by general formula (II') is preferably from 30 mol % to 70 mol %, more preferably from 32 mol % to 68 mol %, and still more preferably from 35 mol % to 65 mol %, based on the total monomer repeating units.

When the alkali-soluble resins contain the repeating units represented by general formulas (I') and (II'), the content of the repeating units represented by general formulas (III-a) to (III-d) is preferably from 0.1 mol % to 20 mol %, more preferably from 0.5 mol % to 13 mol %, and more preferably from 1 mol % to 16 mol %, based on the total monomer repeating units.

Further, the content of the repeating units in the resins based on the above-mentioned further copolymerization component monomers can also be appropriately established depending on the desired performance of resists. In general, however, it is preferably 99 mol % or less, more preferably 90 mol % or less, and still more preferably 80 mol % or less, based on the total molar number of essential repeating units.

The weight-average molecular weight Mw (in terms of standard polystyrene) of the alkali-soluble resins as described above ranges preferably from 1,000 to 1,000,000, more preferably from 1,500 to 500,000, still more preferably from 2,000 to 200,000, and yet still more preferably from 2,500 to 100,000. A higher weight-average molecular weight results in more improved heat resistance, whereas results in lower development properties. It is therefore adjusted to the preferred range according to the balance of these.

The alkali-soluble resins used in the invention can be synthesized by conventional processes, for example, radical polymerization.

In the positive-working photoresist compositions of the invention, the amount of the alkali-soluble resins added to the entire compositions is preferably from 40% to 99.99% by weight, and more preferably from 50% to 99.97% by weight, based on the total solid content of resist.

The positive-working resist compositions of the invention are dissolved in solvents which can dissolve the above-mentioned respective components, and applied onto supports. Preferred examples of the solvents used herein include diethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidinone and tetrahydrofuran. These solvents are used either alone or as a mixture thereof.

Of the above, preferred examples of the solvents include 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidinone and tetrahydrofuran.

The composition of the invention preferably comprises a mixed solvent (iii-1) containing (1) at least one of propylene glycol monomethyl ether acetate or propylene glycol monomethyl ether propionate (hereinafter also referred to as a solvent of (1)) and (2) at least one of ethyl lactate, propylene glycol monomethyl ether and ethoxyethyl propionate (hereinafter also referred to as a solvent of (2)), as well as the photoacid generator (i) and the alkali-soluble resin (ii).

The weight ratio of the solvent of (1) to the solvent of (2) [(1):(2)] used in the mixed solvent (iii-1) is preferably from 95:5 to 50:50, and more preferably from 90:10 to 60:40.

A combination of the solvent of (1) and the solvent of (2) used in the mixed solvents (iii-1) is preferably propylene glycol monomethyl ether acetate+ethyl lactate, propylene glycol monomethyl ether acetate+propylene glycol monomethyl ether, or propylene glycol monomethyl ether acetate+ ethoxyethyl propionate.

Further, the composition of the invention preferably comprises a mixed solvent (iii-2) containing (1) at least one of propylene glycol monomethyl ether acetate or propylene glycol monomethyl ether propionate (hereinafter also referred to as a solvent of (1)) and (2) at least one of γ-butyrolactone, ethylene carbonate and propylene carbonate (hereinafter also referred to as a solvent of (2)), as well as the photoacid generator (i) and the alkali-soluble resin (ii).

As the ratio of the solvent of (1) to the solvent of (2) used in the mixed solvent (iii-2), the amount of the solvent of (2) used is preferably from 0.5% to 30% by weight, more preferably from 1% to 20% by weight, and still more preferably from 3% to 10% by weight, based on the total weight of the solvent of (1) and the solvent of (2).

A combination of the solvent of (1) and the solvent of (2) used in the mixed solvent (iii-2) is preferably propylene glycol monomethyl ether acetate+γ-butyrolactone, propylene glycol monomethyl ether acetate+ethylene carbonate, or propylene glycol monomethyl ether acetate+propylene carbonate.

Still further, the composition of the invention preferably comprises a mixed solvent (iii-3) containing (1) heptanone (hereinafter also referred to as a solvent of (1)) and (2) at least one of ethyl lactate, propylene glycol monomethyl ether and ethoxyethyl propionate (hereinafter also referred to as a solvent of (2)) as well as the photoacid generator (i) and the alkali-soluble resin (ii). Heptanone includes 2-heptanone, 3-heptanone and 4-heptanone, and 2-heptanone is preferred.

The weight ratio of the solvent of (1) to the solvent of (2) [(1):(2)] used in the mixed solvent (iii-3) is preferably from 97:3 to 5:95, more preferably from 95:5 to 10:90, and still more preferably from 90:10 to 20:80.

A combination of the solvent of (1) and the solvent of (2) used in the mixed solvents (iii-3) is preferably 2-heptanone +ethyl lactate, 2-heptanone+propylene glycol monomethyl ether, or 2-heptanone+ethoxyethyl propionate.

Yet still further, the composition of the invention preferably comprises a mixed solvent (iii-4) containing (1) heptanone (hereinafter also referred to as a solvent of (1)) and (2) at least one of γ-butyrolactone, ethylene carbonate and propylene carbonate (hereinafter also referred to as a solvent of (2)), as well as the photoacid generator (i) and the alkali-soluble resin (ii).

In the invention, heptanone includes 2-heptanone, 3-heptanone and 4-heptanone, and 2-heptanone is preferred.

As the ratio of the solvent of (1) to the solvent of (2) used in the mixed solvent (iii-4), the amount of the solvent of (2) used is preferably from 0.5% to 30% by weight, more preferably from 1% to 20% by weight, and still more preferably from 3% to 10% by weight, based on the total weight of the solvent of (1) and the solvent of (2).

A combination of the solvent of (1) and the solvent of (2) used in the mixed solvents (iii-4) is preferably 2-heptanone+ γ-butyrolactone, 2-heptanone+ethylene carbonate, or 2-heptanone+propylene carbonate.

The solid components of the photoacid generators (i) and the alkali-soluble resins (ii) are dissolved in the mixed solvents preferably at a solid concentration of 5% to 25%, more preferably at a solid concentration of 6% to 20%.

It is preferred that the positive-working photoresist compositions of the invention further contain fluorine and/or silicon surfactants, thereby allowing the storage stability of resist solutions to become more excellent.

The fluorine and/or silicon surfactants are surfactants of at least one kind selected from fluorine surfactants, silicon surfactants and surfactants containing both fluorine atoms and silicon atoms.

These surfactants include, for example, surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5986, and the following commercially available surfactants can also be used. Examples of the commercially available surfactants include fluorine surfactants and silicon surfactants such as Eftop EF301, EF303 and EF352 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink & Chemicals, Inc.), and Surflon S-382, SC101, SC102, SC103, SC104, SC105 and SC106 (manufactured by Asahi Glass Co., Ltd.). Further, Polysiloxane Polymer KP-341 (manufactured by Shin-Etsu Chemical Co., Ltd.) can also be used as the silicon surfactant.

The amount of the surfactants compounded is usually from 0.001% to 2% by weight, and preferably from 0.01% to 1% by weight, based on the solid component in the composition of the invention.

These surfactants can be used either alone or as a combination of two or more of them.

Other surfactants may also be added to the compositions of the invention. Examples of such other surfactants include nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of the surfactants compounded is usually 2 parts or less by weight, and preferably 1 part or less by weight, per 100 parts by weight of the solid component in the composition of the invention.

These surfactants can be added either alone or as a combination of some of them.

In the invention, it is preferred that organic basic compounds are further used for allowing the storage stability of resist solutions to become more excellent. The organic basic compounds are compounds stronger in basicity than phenol, and nitrogen-containing basic compounds are preferred among others. The nitrogen-containing basic compounds include compounds having the following structures:

(A)

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, and $R^{251}$ and $R^{252}$ may combine with each other to form a ring.

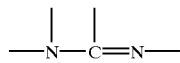
(B)

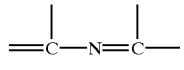
(C)

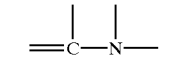
(D)

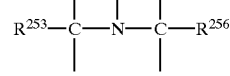
(E)

wherein $R^{235}$, $R^{254}$, and $R^{256}$, which may be the same or different, each represents an alkyl group having 1 to 6 carbon atoms.

The nitrogen containing basic compounds are more preferably compounds each having two or more nitrogen atoms different in chemical environment in one molecule, and particularly preferred are compounds each having both a substituted or unsubstituted amino group and a nitrogen atom-containing ring structure, or compounds each having an alkylamino group. Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines. Preferred substituent groups are amino, aminoalkyl, alkylamino, aminoaryl, arylamino, alkyl, alkoxy, acyl, acyloxy, aryl, aryloxy, nitro, hydroxyl and cyano. Preferred examples of the compounds include but are not limited to guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 9-amino-4-methylpyridine, 2-amino-3-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(amino-methyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]nona-5-ene, 1,8-diazabicyclo[5,4,0]undeca-7-ene, 2,4,5-triphenylimidazole, N-methylmorpholine, N-ethyl-morpholine, N-hydroxyethylmorpholine, N-benzylmorpholine, tertiary morpholine derivatives such as cyclohexylmorpholinoethylthiourea (CHMETU), and hindered amines described in JP-A-11-52575 (for example, described in [0005] of the patent publication)

Particularly preferred examples thereof include 1,5-diazabicyclo[4,3,0]nona-5-ene, 1,8-diazabicyclo[5;4,0]undeca-7-ene, 1,4-diazabicyclo[2.2.2]octane, 4-dimethylamino-pyridine, hexamethylenetetramine, 4,4-dimethylimidazoline, pyrroles, pyrazoles, imidazoles, pyridazines, pyrimidines, tertiary morpholine derivatives such as CHMETU and hindered amines such as bis(1,2,2,6,6-entamethyl-4-piperidyl) sebacate.

Of these, 1,5-diazabicyclo[4,3,0]nona-5-ene, 1,8-diazabicyclo[5,4,0]undeca-7-ene, 1,4-diazabicyclo[2,2,2]-octane, 4-dimethylaminopyridine, hexamethylenetetramine, CHMETU and bis(1,2,2,6,6-pentamethyl-4-piperidyl) sebacate are preferred.

These nitrogen-containing basic compounds are used alone or as a combination of two or more of them. The amount of the nitrogen-containing basic compounds used is usually from 0.001 to 10% by weight, and preferably form 0.01 to 5% by weight, based on the total solid content of resist composition. Less than 0.001% by weight does not give the effects of addition of the nitrogen-containing basic compounds, whereas exceeding 10% by weight results in liability to decrease the sensitivity and to deteriorate the development properties of non-exposed areas.

The positive-working photoresist compositions of the invention may further contain compounds for preventing acid-decomposable dissolution, dyes, plasticizers, photosensitizers and compounds for enhancing the solubility in developing solutions, as needed.

Such positive-working photoresist compositions of the invention are applied onto substrates to form thin films. The thickness of the coating films is preferably from 0.2 $\mu$m to 1.2 $\mu$m. In the invention, inorganic or organic anti-reflection coatings can be used as needed, and materials therefor are commercially available.

The anti-reflection coatings which can be used include inorganic type coatings comprising inorganic materials such as titanium, titanium dioxide, titanium nitride, chromium oxide, carbon and a-silicon, and organic type coatings comprising light absorbing agents and polymer materials. The former case necessitates an apparatus such as a vacuum evaporator, a CVD apparatus or a sputtering apparatus. The organic anti-reflection coatings include, for example, coatings comprising condensates of diphenylamine derivatives and formaldehyde-modified melamine resins, alkali-soluble resins and light absorbing agents as described in JP-B-7-69611 (the term "JP-B" as used herein means an "examined Japanese patent publication") coatings comprising reaction products of maleic anhydride copolymers and diamine type light absorbing agents as described in U.S. Pat. No. 5,294,680, coatings containing resin binders and methylolmelamine crosslinking agents as described:in JP-A-6-118531, acrylic resin type anti-reflection coatings having carboxylic acid groups, epoxy groups and light absorbing groups in the same molecules as described in JP-A-6-118656, coatings comprising methylolmelamine and benzophenone light absorbing agents as described in JP-A-8-87115 and coatings in which low-molecular light absorbing agents are added to polyvinyl alcohol resins as described in JP-A-8-179509.

Further, as the organic anti-reflection coatings, DUV-30 series and DUV-40 series manufactured by Brewer Science Co., and AC-2 and AC-3 manufactured by Shipley Co. can also be used.

The above-mentioned resist solutions are applied onto substrates (for example, silicon/silicon dioxide coatings) as used for the production of micro integrated circuit elements by appropriate coating processes such as processes using spinners or coaters, followed by exposure through specified masks, baking and development. Thus, good resist patterns can be obtained. Exposure light used herein is preferably light having a wavelength of 150 nm to 250 nm. Specific examples thereof include an KrF excimer laser beam (248 nm), an ArF excimer laser beam (193 nm) an $F_2$ excimer laser beam (157 nm), X-rays and electron beams.

Developing solutions which can be used include alkaline aqueous solutions of inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethyl-ammonium hydroxide; and cyclic amines such as pyrrole and piperidine.

Further, alcohols and/or surfactants can also be added in appropriate amounts to the above-mentioned alkaline aqueous solutions.

The present invention will hereinafter be described in more detail by reference to examples, which are, however, not to be construed as limiting the invention.

Synthesis of Resins

Synthesis Example 1 Synthesis of Resin 1-1

2-Methyl-2-adamantyl methacrylate, butyrolactone methacrylate and methacrylic acid were placed in a vessel at a ratio of 40/54/6, and dissolved in a 5/5 solvent of N,N-dimethylacetamide/tetrahydrofuran to prepare 100 ml of a solution having a solid content of 20%. To this solution, 2 mol % of V-65 manufactured by Wako Pure Chemical Industries Ltd. was added. The resulting solution was added dropwise under an atmosphere of nitrogen for 2 hours to 10 ml of N,N-dimethylacetamide heated to 60° C. After the solution had been added dropwise, the reaction solution was heated for 3 hours, and 1 mol % of V-65 was added again, followed by stirring for 3 hours. After the reaction was completed, the reaction solution was cooled to room temperature, and crystallization was performed in 3 liters of distilled water. Then, a white powder precipitated was collected.

The polymer composition ratio determined from $^{13}$C-NMR was 39/53/8. The weight-average molecular weight determined by the GPC measurement was 10,400 in terms of standard polystyrene.

In resins 1 to 14 shown by the following structures, resins 1-2 to 14-2 having composition ratios and weight-average molecular weights shown in Table 1 were synthesized by procedures similar to that of the above-mentioned Synthesis Example 1. Repeating units 1, 2 and 3 indicate the order of repeating units from the left in each structure formula.

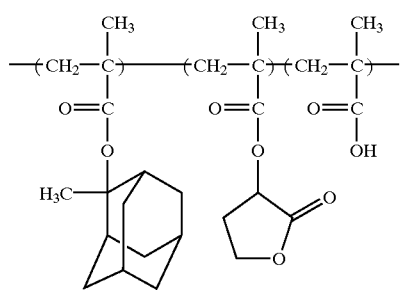

1

2
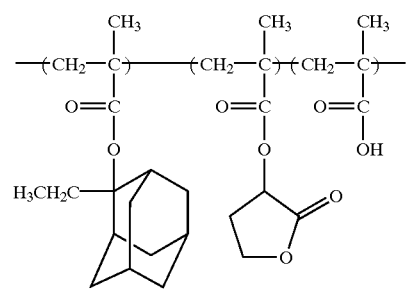
3
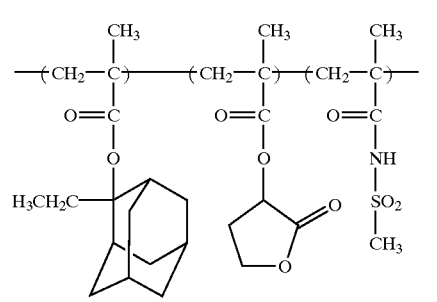
4
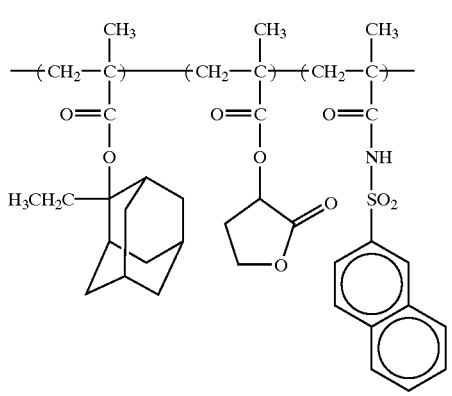
5
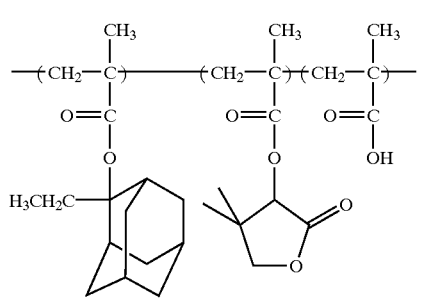
6
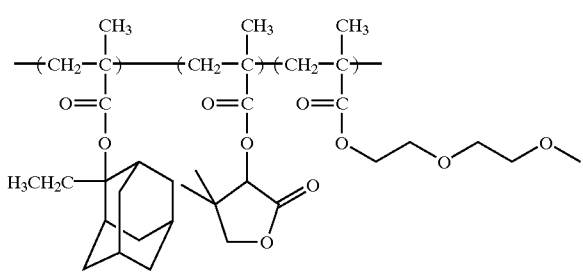
7
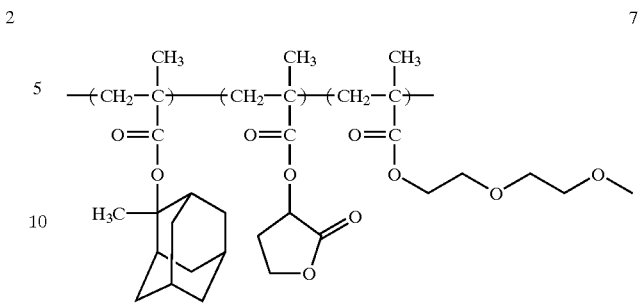
8
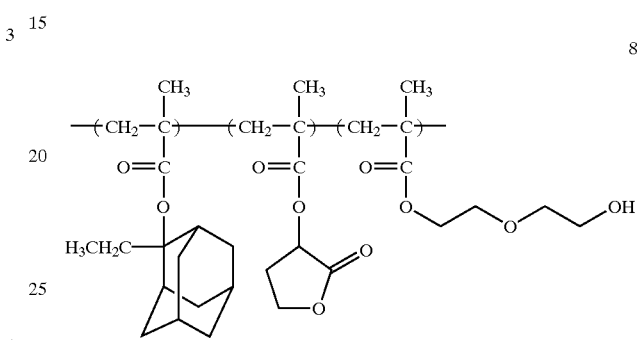
9
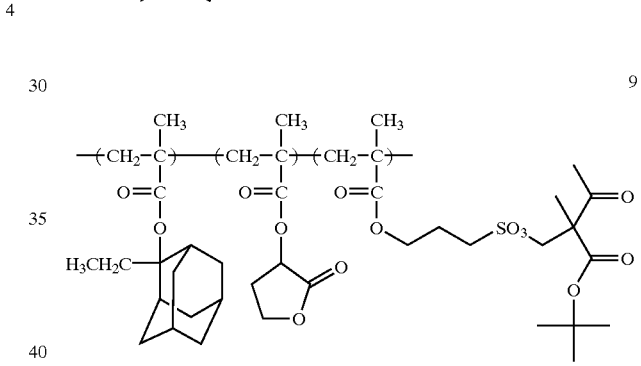
10
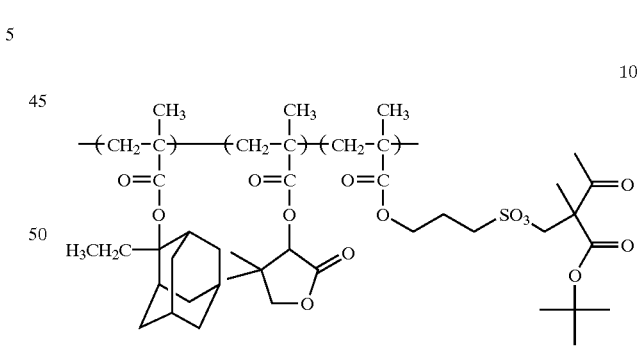
11
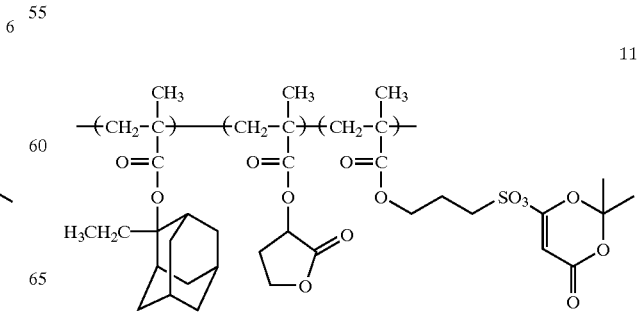

-continued

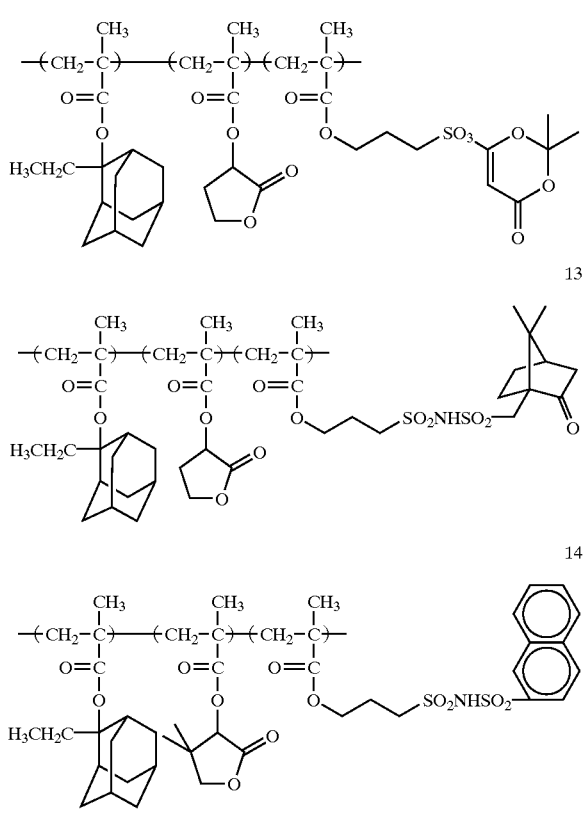

TABLE 1

| Resin | Repeating Unit 1 (mol %) | Repeating Unit 2 (mol %) | Repeating Unit 3 (mol %) | Molecular Weight |
|---|---|---|---|---|
| 1-2 | 40 | 48 | 12 | 10600 |
| 1-3 | 40 | 44 | 16 | 10100 |
| 2-1 | 43 | 49 | 8 | 9500 |
| 2-2 | 41 | 45 | 14 | 9200 |
| 3-1 | 41 | 51 | 8 | 10400 |
| 3-2 | 42 | 47 | 11 | 9600 |
| 4-1 | 40 | 55 | 5 | 11300 |
| 4-2 | 39 | 53 | 8 | 9300 |
| 5-1 | 40 | 54 | 6 | 9700 |
| 5-2 | 41 | 49 | 10 | 9200 |
| 5-3 | 39 | 46 | 15 | 8600 |
| 6-1 | 43 | 55 | 2 | 13400 |
| 6-2 | 43 | 53 | 4 | 13100 |
| 7-1 | 40 | 58 | 2 | 12900 |
| 7-2 | 40 | 56 | 4 | 12300 |
| 8-1 | 44 | 53 | 3 | 11800 |
| 8-2 | 42 | 54 | 4 | 12000 |
| 9-1 | 46 | 51 | 3 | 11000 |
| 9-2 | 49 | 47 | 4 | 11300 |
| 9-3 | 48 | 47 | 5 | 11800 |
| 10-1 | 44 | 54 | 2 | 12200 |
| 10-2 | 45 | 52 | 3 | 11800 |
| 11-1 | 48 | 49 | 3 | 13100 |
| 11-2 | 49 | 46 | 5 | 13400 |
| 12-1 | 50 | 48 | 2 | 11900 |
| 12-2 | 49 | 47 | 4 | 11800 |
| 13-1 | 47 | 51 | 2 | 12100 |
| 13-2 | 48 | 48 | 4 | 12900 |
| 14-1 | 49 | 48 | 3 | 11200 |
| 14-2 | 47 | 49 | 4 | 11400 |

EXAMPLES 1-1 TO 1-60

Comparative Examples 1-1 to 1-4

Preparation and Evaluation of Photosensitive Compositions 1.4 g of each resin synthesized above, 0.2 g of a photoacid generator, 10 mg of an organic basic compound (amine) and optionally a surfactant (0.15 g) were compounded as shown in Tables 2 and 3, and dissolved in propylene glycol monoethyl ether acetate, so as to give a solid content of 14% by weight. Then, the resulting solution was filtered through a 0.1-$\mu$m microfilter. Thus, positive-working resist compositions of Examples 1-1 to 1-60 were prepared.

Further, as Comparative Examples 1-1 to 1-4, positive-working resist compositions were each prepared in the same manner as with Examples 1-1 to 1-60 with the exception that resin R1 or R2 shown below and a photoacid generator were used as shown in Tables 2 and 3.
(Resin R1)
A resin used in Example 50 described in JP-A-9-73173 was used as resin R1.
(Resin R2)
A resin synthesized in Synthesis Example 10 described in JP-A-10-274852 was used as resin R2.

In the following Tables 2 and 3, PAG-1 indicates triphenylsulfonium triflate, PAG-2 indicates (PAG4-36) described above, and PAG-3 indicates (PAG4-37) described above. As the amines, 1 indicates 1,5-diazabicyclo[4,3,0]nona-5-ene (DBN), and 2 indicates bis(1,2,2,6,6-pentamethyl-4-piperidyl) sebacate. As the surfactants, W-1 indicates Megafac F176 (manufactured by Dainippon Ink & Chemicals, Inc.) (fluorine series) (silicone series), W-2 indicates Megafac R08 (manufactured by Dainippon Ink & Chemicals, Inc.) (fluorine and silicone series), W-3 indicates Polysiloxane Polymer KP-341 (manufactured by Shin-Etsu Chemical Co., Ltd.), and W-4 indicates polyoxyethylene nonyl phenyl ether.
(Evaluation Tests)

The resulting positive-working photoresist solution was applied onto a silicon wafer with a spin coater, and dried at 130° C. for 90 seconds to prepare a positive-working photoresist film having a thickness of about 0.4 $\mu$m, which was exposed to an ArF excimer laser beam (wavelength:193 nm, ArF stepper of NA=0.6 manufactured by ISI Co.) After exposure, heat treatment was carried out at 120° C. for 90 seconds. Then, the photoresist film was developed with a 2.38% aqueous solution of tetramethylammonium hydroxide, and rinsed with distilled water to obtain a resist pattern profile.

For this, the profile and the development properties (generation of development defects) were evaluated. Evaluation results thereof are shown in Tables 2 and 3.
[Profile]

When the cross sectional shape of a resist pattern profile was rectangular, it was taken as ○. When the tip portion of the cross sectional shape thereof was pent roof-like, it was taken as ×.
[Development Defects (Number)]

Each resist solution was applied onto a 6-inch bare Si substrate to a thickness of 0.5 $\mu$m, and dried on a vacuum adsorption type hot plate at 130° C. for 60 seconds. Then, the resulting resist film was exposed with FPA 3000 EX5 manufactured by Canon Inc. through a test mask of a 0.35-$\mu$m contact hole pattern (hole duty ratio=1:3), and heated at 120° C. for 90 seconds. Subsequently, paddle development was carried out with a 2.38% aqueous solution of tetramethylammonium hydroxide (TMAH) for 60 seconds, followed by washing with pure water for 30 seconds. Then, the resist film was subjected to postbake at 110° C. for 120 seconds, and spin dried. For the sample thus obtained, the number of development defects was measured with a KL 2112 apparatus manufactured by KLA Tencor Co., and the resulting primary data was taken as the number of development defects.

[Resolving Power of Contact Hole]

The contact hole diameter resolving at an exposure for reproducing a resist pattern (hole duty ratio=1:2) having a hole diameter of 0.25 μm was taken as the resolving power.

TABLE 2

| | Resin | Photoacid Generator | Amine | Pattern Profile | Number of Development Defects | Resolving Power of Contact Hole (μm) |
|---|---|---|---|---|---|---|
| Example No. | | | | | | |
| 1-1 | 1-1 | PAG-1 | 2 | ○ | 60 | 0.21 |
| 1-2 | 1-3 | PAG-2 | 1 | ○ | 70 | 0.21 |
| 1-3 | 2-1 | PAG-3 | 1 | ○ | 60 | 0.22 |
| 1-4 | 2-2 | PAG-1 | 1 | ○ | 80 | 0.22 |
| 1-5 | 3-1 | PAG-1 | 1 | ○ | 70 | 0.21 |
| 1-6 | 3-2 | PAG-3 | 2 | ○ | 90 | 0.21 |
| 1-7 | 4-1 | PAG-1 | 1 | ○ | 80 | 0.22 |
| 1-8 | 4-2 | PAG-1 | 1 | ○ | 60 | 0.22 |
| 1-9 | 5-1 | PAG-2 | 1 | ○ | 70 | 0.21 |
| 1-10 | 5-2 | PAG-1 | 1 | ○ | 90 | 0.22 |
| 1-11 | 5-3 | PAG-3 | 1 | ○ | 80 | 0.21 |
| 1-12 | 6-1 | PAG-2 | 1 | ○ | 90 | 0.22 |
| 1-13 | 6-2 | PAG-2 | 1 | ○ | 80 | 0.22 |
| 1-14 | 7-1 | PAG-1 | 2 | ○ | 80 | 0.22 |
| 1-15 | 7-2 | PAG-3 | 1 | ○ | 90 | 0.22 |
| 1-16 | 8-1 | PAG-2 | 1 | ○ | 80 | 0.22 |
| 1-17 | 8-2 | PAG-2 | 1 | ○ | 80 | 0.22 |
| 1-18 | 9-1 | PAG-3 | 1 | ○ | 50 | 0.20 |
| 1-19 | 9-2 | PAG-2 | 2 | ○ | 50 | 0.20 |
| 1-20 | 9-3 | PAG-2 | 1 | ○ | 50 | 0.20 |
| 1-21 | 10-1 | PAG-1 | 1 | ○ | 50 | 0.20 |
| 1-22 | 10-2 | PAG-2 | 1 | ○ | 50 | 0.20 |
| 1-23 | 11-1 | PAG-2 | 1 | ○ | 45 | 0.20 |
| 1-24 | 11-2 | PAG-2 | 1 | ○ | 45 | 0.20 |
| 1-25 | 12-1 | PAG-3 | 1 | ○ | 45 | 0.20 |
| 1-26 | 12-2 | PAG-2 | 1 | ○ | 45 | 0.20 |
| 1-27 | 13-1 | PAG-1 | 1 | ○ | 80 | 0.22 |
| 1-28 | 13-2 | PAG-3 | 2 | ○ | 90 | 0.22 |
| 1-29 | 14-1 | PAG-1 | 1 | ○ | 80 | 0.22 |
| 1-30 | 14-2 | PAG-1 | 1 | ○ | 90 | 0.22 |
| Comparative Example | | | | | | |
| 1-1 | R1 | PAG-1 | 2 | x | 6000 | 0.25 |
| 1-2 | R2 | PAG-1 | 2 | x | 2000 | 0.24 |

TABLE 3

| | Resin | Photoacid Generator | Surfactant | Amine | Pattern Profile | Number of Development Defects | Resolving Power of Contact Hole (μm) |
|---|---|---|---|---|---|---|---|
| Example No. | | | | | | | |
| 1-31 | 1-2 | PAG-1 | W-1 | 1 | ○ | 50 | 0.20 |
| 1-32 | 1-3 | PAG-3 | W-2 | 2 | ○ | 50 | 0.20 |
| 1-33 | 2-1 | PAG-3 | W-3 | 1 | ○ | 45 | 0.20 |
| 1-34 | 2-2 | PAG-1 | W-4 | 1 | ○ | 75 | 0.22 |

TABLE 3-continued

| | Resin | Photoacid Generator | Surfactant | Amine | Pattern Profile | Number of Development Defects | Resolving Power of Contact Hole (μm) |
|---|---|---|---|---|---|---|---|
| 1-35 | 3-1 | PAG-3 | W-1 | 2 | ○ | 50 | 0.20 |
| 1-36 | 3-2 | PAG-3 | W-2 | 1 | ○ | 60 | 0.20 |
| 1-37 | 4-1 | PAG-1 | W-3 | 1 | ○ | 50 | 0.20 |
| 1-38 | 4-2 | PAG-3 | W-4 | 1 | ○ | 60 | 0.22 |
| 1-39 | 5-1 | PAG-3 | W-2 | 1 | ○ | 55 | 0.20 |
| 1-40 | 5-2 | PAG-1 | W-3 | 1 | ○ | 60 | 0.20 |
| 1-41 | 5-3 | PAG-3 | W-1 | 2 | ○ | 50 | 0.20 |
| 1-42 | 6-1 | PAG-3 | W-2 | 1 | ○ | 50 | 0.20 |
| 1-43 | 6-2 | PAG-3 | W-3 | 1 | ○ | 45 | 0.20 |
| 1-44 | 7-1 | PAG-1 | W-4 | 1 | ○ | 75 | 0.22 |
| 1-45 | 7-2 | PAG-2 | W-1 | 1 | ○ | 55 | 0.20 |
| 1-46 | 8-1 | PAG-3 | W-2 | 2 | ○ | 50 | 0.20 |
| 1-47 | 8-2 | PAG-2 | W-3 | 1 | ○ | 50 | 0.20 |
| 1-46 | 9-1 | PAG-1 | W-1 | 1 | ○ | 30 | 0.19 |
| 1-49 | 9-2 | PAG-3 | W-2 | 1 | ○ | 30 | 0.19 |
| 1-50 | 9-3 | PAG-2 | W-4 | 1 | ○ | 30 | 0.20 |
| 1-51 | 10-1 | PAG-3 | W-1 | 1 | ○ | 30 | 0.19 |
| 1-52 | 10-2 | PAG-3 | W-2 | 2 | ○ | 30 | 0.19 |
| 1-53 | 11-1 | PAG-2 | W-3 | 1 | ○ | 25 | 0.19 |
| 1-54 | 11-2 | PAG-2 | W-4 | 1 | ○ | 35 | 0.19 |
| 1-55 | 12-1 | PAG-2 | W-1 | 1 | ○ | 25 | 0.19 |
| 1-56 | 12-2 | PAG-1 | W-4 | 1 | ○ | 35 | 0.20 |
| 1-57 | 13-1 | PAG-1 | W-2 | 2 | ○ | 55 | 0.20 |
| 1-58 | 13-2 | PAG-2 | W-3 | 1 | ○ | 50 | 0.20 |
| 1-59 | 14-1 | PAG-2 | W-1 | 1 | ○ | 55 | 0.20 |
| 1-60 | 14-2 | PAG-2 | W-1 | 1 | ○ | 50 | 0.21 |
| Comparative Example | | | | | | | |
| 1-3 | R1 | PAG-1 | W-1 | 1 | x | 4000 | 0.24 |
| 1-4 | R1 | PAG-1 | W-1 | 1 | x | 1800 | 0.23 |

As apparent from the results shorn in Tables 2 and 3, the positive-working resist compositions of the invention are all on a satisfactory level. That is to say, they are suitable for lithography using far ultraviolet ray exposure including ArF excimer laser exposure.

Synthesis Example 2 Synthesis of Resin (1)-1

2-Methyl-2-adamantyl methacrylate, butyrolactone methacrylate and methacrylic acid were placed in a vessel at a ratio of 40/48/12, and dissolved in a 5/5 solvent of N,N-dimethylacetamide/tetrahydrofuran to prepare 100 ml of a solution having a solid content of 20%. To this solution, 4 mol % of V-65 manufactured by Wako Pure Chemical Industries Ltd. was added. The resulting solution was added dropwise under an atmosphere of nitrogen for 2 hours to 10 ml of N,N-dimethylacetamide heated to 60° C. After the solution had been added dropwise, the reaction solution was heated for 3 hours, and 2 mol % of V-65 was added again, followed by stirring for 3 hours. After the reaction was completed, the reaction solution was cooled to room temperature, and crystallization was performed in 3 liters of distilled water. Then, a white powder precipitated was collected.

The polymer composition ratio determined from $^{13}$C-NMR was 40/47/13. The weight-average molecular weight determined by the GPC measurement was 6,800 in terms of standard polystyrene.

Resins having composition ratios and weight-average molecular weights shown in Table 4 were synthesized according to the following structures by procedures similar to, that of the above-mentioned Synthesis Example 1. Repeating units 1, 2 and 3 indicate the order of repeating units from the left in each structure formula.

(1) 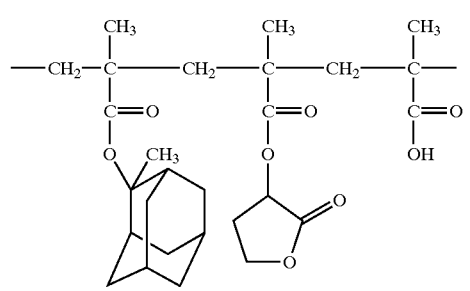
(2) 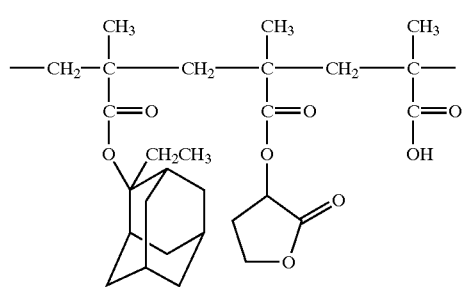
(3) 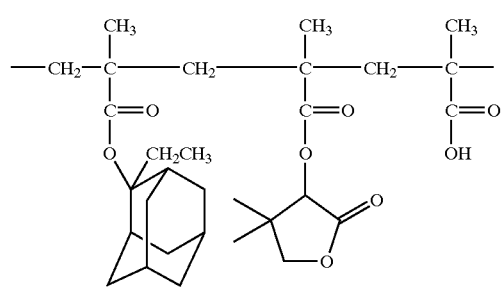
(4) 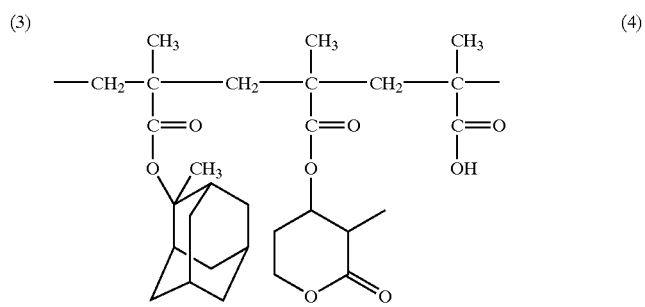
(5) 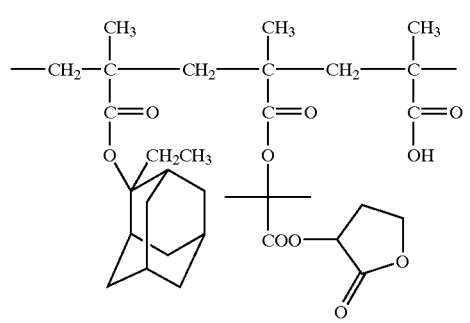
(6) 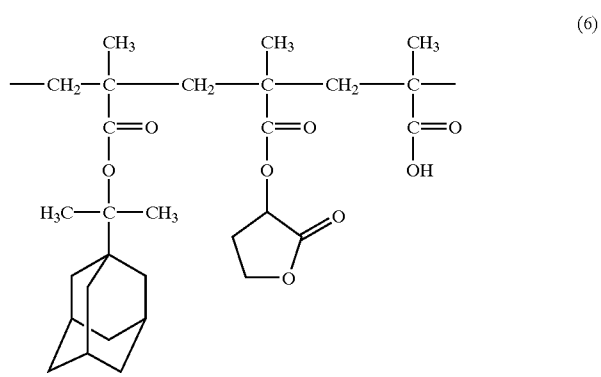
(7) 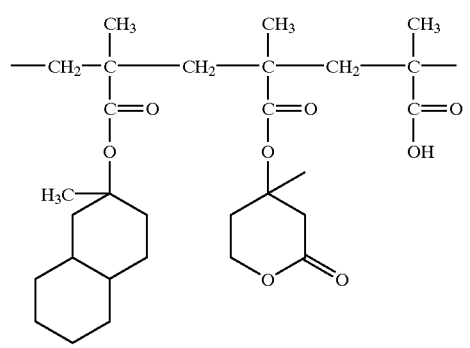
(8) 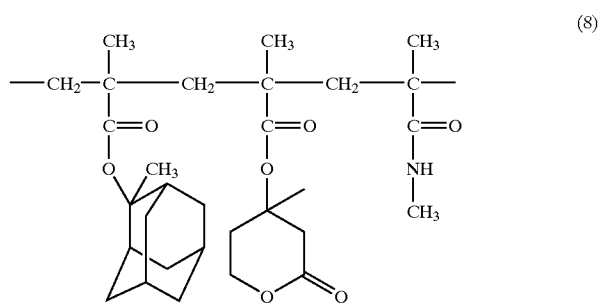
(9) 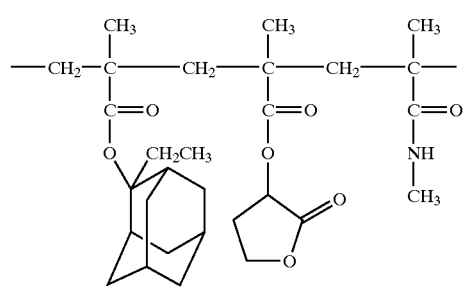
(10) 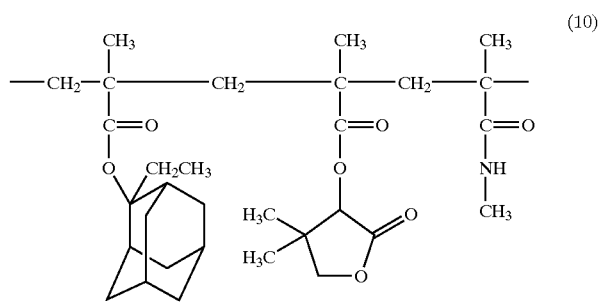

-continued
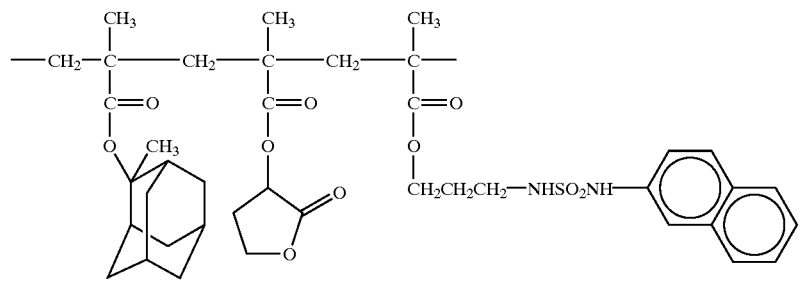
(11)
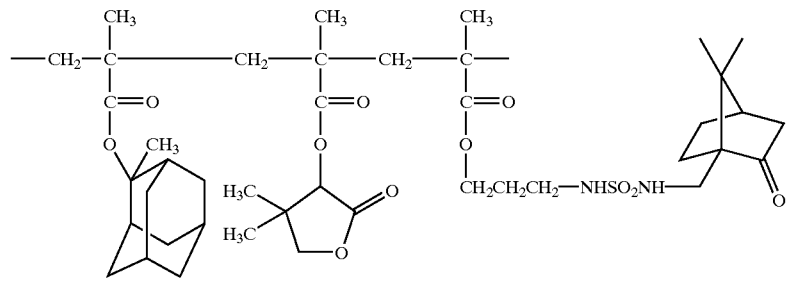
(12)
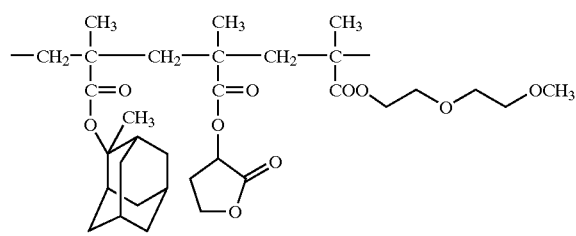
(13)
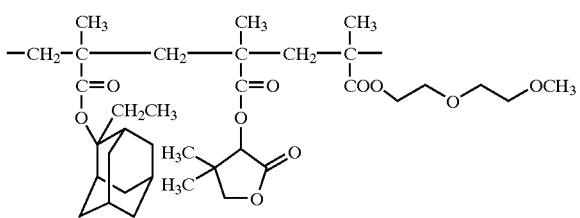
(14)
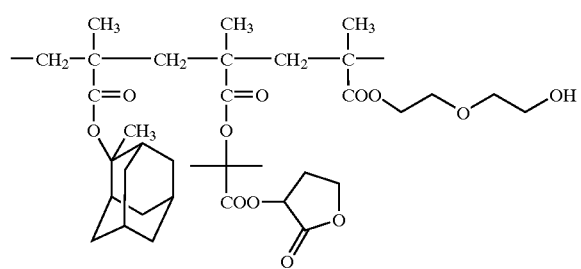
(15)
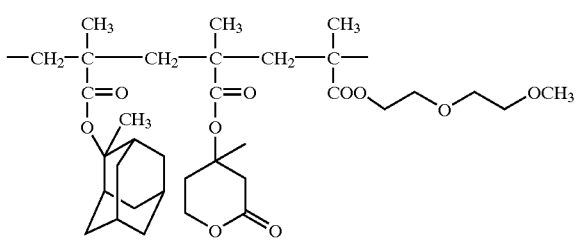
(16)
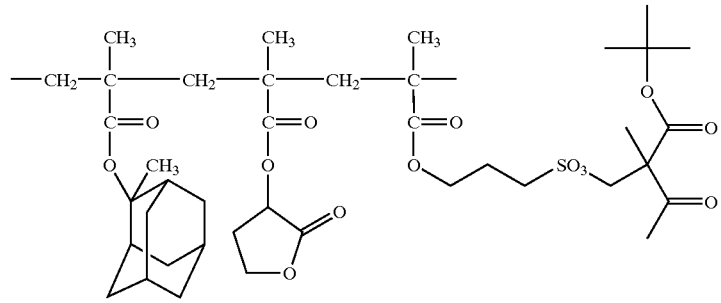
(17)

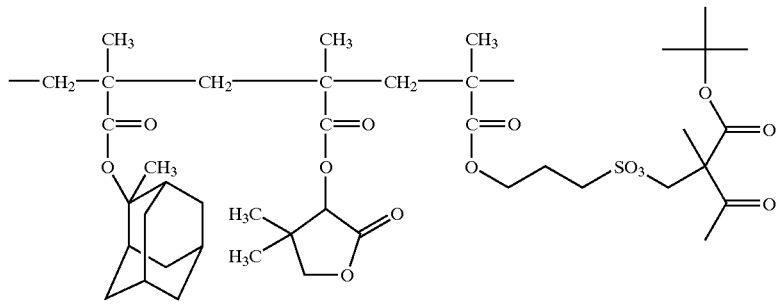
(18)
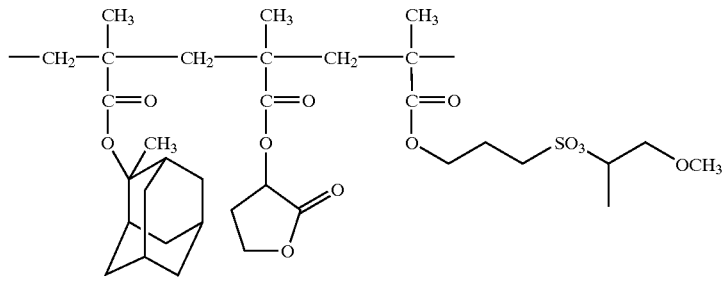
(19)
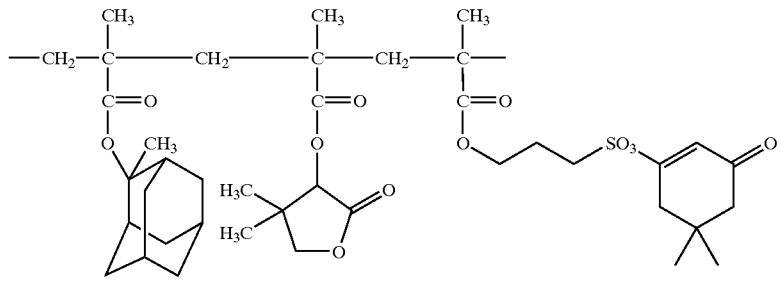
(20)
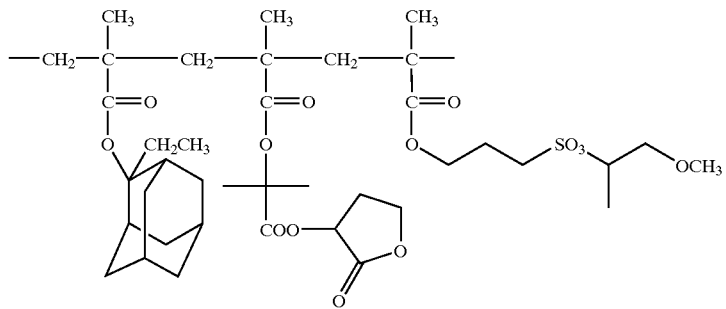
(21)
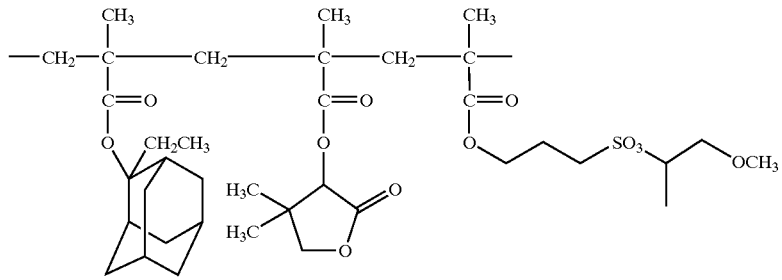
(22)

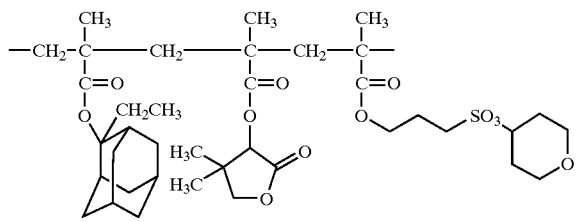
(23)

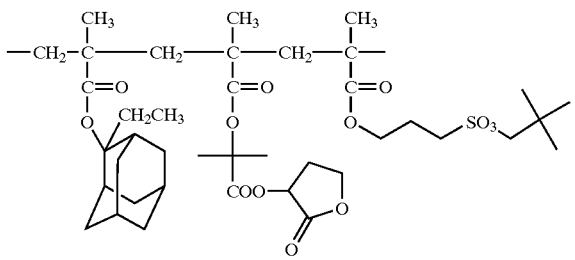
(24)

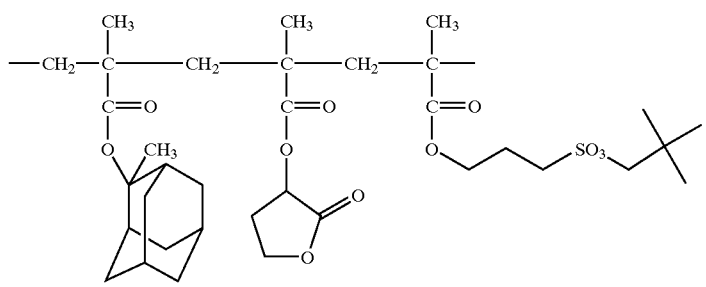
(25)

TABLE 4

| Resin | Repeating Unit 1 (mol %) | Repeating Unit 2 (mol %) | Repeating Unit 3 (mol %) | Molecular Weight |
|---|---|---|---|---|
| (1)-2 | 44 | 50 | 6 | 6600 |
| (1)-3 | 40 | 45 | 15 | 6500 |
| (2)-1 | 41 | 52 | 7 | 6600 |
| (2)-2 | 40 | 48 | 12 | 7100 |
| (2)-3 | 39 | 46 | 15 | 7300 |
| (3)-1 | 43 | 51 | 6 | 6100 |
| (3)-2 | 41 | 47 | 12 | 6500 |
| (4) | 43 | 43 | 14 | 7500 |
| (5) | 42 | 44 | 14 | 7200 |
| (6) | 40 | 50 | 10 | 6400 |
| (7) | 45 | 46 | 9 | 6600 |
| (8)-1 | 46 | 46 | 8 | 7300 |
| (8)-2 | 43 | 45 | 12 | 7200 |
| (9)-1 | 41 | 53 | 6 | 7300 |
| (9)-2 | 40 | 50 | 10 | 7700 |
| (9)-3 | 39 | 47 | 14 | 7400 |
| (10)-1 | 42 | 48 | 10 | 7100 |
| (10)-2 | 40 | 47 | 13 | 7000 |
| (11) | 45 | 53 | 2 | 6600 |
| (12) | 43 | 54 | 3 | 6800 |
| (13) | 45 | 53 | 2 | 7400 |
| (14) | 44 | 53 | 3 | 8100 |
| (15) | 47 | 51 | 2 | 7900 |
| (16) | 50 | 47 | 3 | 8300 |
| (17) | 51 | 47 | 2 | 7800 |
| (18) | 49 | 48 | 3 | 7200 |
| (19) | 51 | 47 | 2 | 8100 |
| (20) | 49 | 49 | 2 | 7300 |
| (21) | 51 | 45 | 4 | 7800 |
| (22) | 51 | 47 | 2 | 7200 |
| (23) | 50 | 47 | 3 | 7500 |
| (24) | 49 | 49 | 2 | 7600 |
| (25) | 51 | 47 | 2 | 7400 |

EXAMPLES 2-1 TO 2-34

COMPARATIVE EXAMPLE 2

1.4 g of each resin synthesized above, 0.18 g of a photoacid generator, 10 mg of an organic basic compound and 1% by weight of a surfactant were compounded as shown in Tables 5 and 6, and dissolved in a mixed solvent shown in Tables 5 and 6, so as to give a solid content of 14% by weight. Then, the resulting solution was filtered through a 0.1-μm microfilter. Thus, positive-working resist compositions of Examples 2-1 to 2-34 were prepared.

Further, as Comparative Examples 2, a positive-working resist composition solution for far ultraviolet ray exposure was prepared according to a formulation described in Table 6 in the same manner as with Examples 2-1 to 2-34 with the exception that resin (A4) synthesized by a method described in Synthesis Example 4 of [0073] of JP-A-10-254139 was used as the resin, and a solvent in which 2-heptanone (S6) and ethyl 2-hydroxypropionate (ethyl lactate) (S3) were mixed with each other at a ratio of 70:30 (by weight) was used as the solvent.

In Tables 5 and 6, photoacid generator 1 indicates triphenylsulfonium triflate, photoacid generator 2 indicates (PAG4-35) described above, photoacid generator 3 indicates (PAG4-36) described above, and photoacid generator 4 indicates (PAG4-37) described above.

As the surfactants, W-1 indicates Megafac F176 (manufactured by Dainippon Ink & Chemicals, Inc.) (fluorine and silicone series), W-2 indicates Megafac ROB (manufactured by Dainippon Ink & Chemicals, Inc.) (fluorine and silicone series), W-3 indicates Polysiloxane Polymer KP-341 (manufactured by Shin-Etsu Chemical Co., Ltd.), and W-4 indicates polyoxyethylene nonyl phenyl ether.

As the organic basic compounds, 1 indicates 1,5-diazabicyclo[4,3,0]nona-5-ene (DBN), 2 indicates bis(1,2,2,6,6-pentamethyl-4-piperidyl) sebacate, and 3 indicates tri-n-butylamine.

As the solvents, S1 indicates propylene glycol monomethyl ether acetate, S2 indicates propylene glycol monomethyl ether propionate, S3 indicates ethyl lactate, S4 indicates propylene glycol monomethyl ether, and S5 indicates ethoxyethyl propionate.

(Evaluation Tests)

The resulting positive-working photoresist solution was applied onto a silicon wafer with a spin coater, and dried at 140° C. for 90 seconds to prepare a positive-working photoresist film having a thickness of about 0.5 μm, which was exposed to an ArF excimer laser beam (wavelength:193 nm, stepper of NA=0.55). After exposure, heat treatment was carried out at 120° C. for 90 seconds. Then, the photoresist film was developed with a 2.38% aqueous solution of tetramethyl-ammonium hydroxide, and rinsed with distilled water to obtain a resist pattern profile.

The storage stability of the resist composition was evaluated in the following manner.

[Storage Stability of Resist Composition]

(Coefficient of Sensitivity Variation)

After the resist solution prepared above was stored at 30° C. for 1 month, the sensitivity thereof was evaluated, and the coefficient of sensitivity variation from the sensitivity before the storage was measured. An exposure for reproducing a pattern having a line width of 0.13 μm was taken as the sensitivity, which was measured as a relative sensitivity taking the sensitivity of Example 2-1 as 1.

(Initial Value and Increase in Number of Particles)

Taking the number or particles just after the preparation of the resist solution prepared above as the initial value of particles, the initial value and the number of particles in the solution after the storage of the resist solution at 30° C. for 1 month were measured, and an increase in the number of particles before and after the storage was evaluated. Results thereof are shown in Tables 5 and 6.

TABLE 5

| Example | Resin | Photoacid Generator | Solvent (weight ratio) | Organic Basic Compound | Surfactant | Sensitivity Variation (%) | Initial Value of Particles | Increase in Number of Particles |
|---|---|---|---|---|---|---|---|---|
| 2-1 | (1)-1 | 1 | S1/S5 = 80/20 | 1 | W-1 | 3 | <5 | <5 |
| 2-2 | (1)-2 | 2 | S1/S3 = 90/10 | 2 | W-2 | 3 | <5 | <5 |
| 2-3 | (1)-3 | 3 | S1/S3 = 85/15 | 3 | W-3 | 5 | <5 | 20 |
| 2-4 | (2)-1 | 4 | S1/S4 = 95/5 | 1 | W-1 | 3 | <5 | <5 |
| 2-5 | (2)-2 | 1 | S1/S3 = 90/10 | 2 | W-4 | 4 | 10 | 10 |
| 2-6 | (2)-3 | 2 | S2/S3 = 85/15 | 1 | W-1 | 5 | <5 | <5 |
| 2-7 | (3)-1 | 3 | S2/S4 = 90/10 | 2 | W-2 | 5 | <5 | <5 |
| 2-8 | (3)-2 | 4 | S1/S5 = 85/15 | 1 | W-3 | 3 | <5 | <5 |
| 2-9 | (4) | 3 | S1/S5 = 80/20 | 1 | W-1 | 3 | <5 | <5 |
| 2-10 | (5) | 4 | S1/S3 = 80/20 | 2 | W-2 | 3 | <5 | <5 |
| 2-11 | (6) | 1 | S1/S3 = 90/10 | 1 | W-3 | 3 | <5 | <5 |
| 2-12 | (7) | 1 | S1/S4 = 90/10 | 2 | W-1 | 3 | <5 | <5 |
| 2-13 | (8)-1 | 1 | S1/S5 = 85/15 | 1 | W-2 | 2 | <5 | <5 |
| 2-14 | (8)-2 | 3 | S1/S5 = 70/30 | 2 | W-3 | 2 | <5 | <5 |
| 2-15 | (9)-1 | 1 | S1/S3 = 75/25 | 2 | W-4 | 3 | 10 | 10 |
| 2-16 | (9)-2 | 3 | S1/S3 = 70/30 | 3 | W-1 | 4 | <5 | 15 |
| 2-17 | (9)-3 | 1 | S1/S5 = 80/20 | 1 | W-2 | 2 | <5 | <5 |
| 2-18 | (10)-1 | 4 | S2/S4 = 90/10 | 2 | W-3 | 4 | <5 | <5 |
| 2-19 | (10)-2 | 1 | S1/S5 = 80/20 | 1 | W-1 | 2 | <5 | <5 |

TABLE 6

| Example | Resin | Photoacid Generator | Solvent (weight ratio) | Organic Basic Compound | Surfactant | Sensitivity Variation (%) | Initial Value of Particles | Increase in Number of Particles |
|---|---|---|---|---|---|---|---|---|
| 2-20 | (11) | 2 | S1/S5 = 75/25 | 1 | W-2 | 2 | <5 | <5 |
| 2-21 | (12) | 3 | S1/S3 = 80/20 | 2 | W-3 | 2 | <5 | <5 |
| 2-22 | (13) | 4 | S1/S4 = 85/15 | 2 | W-1 | 3 | <5 | <5 |
| 2-23 | (14) | 2 | S1/S3 = 80/20 | 3 | W-2 | 5 | <5 | 25 |
| 2-24 | (15) | 3 | S1/S3 = 80/20 | 2 | W-3 | 3 | <5 | <5 |
| 2-25 | (16) | 4 | S1/S4 = 90/10 | 2 | W-4 | 4 | 10 | 10 |
| 2-26 | (17) | 3 | S1/S5 = 80/20 | 1 | W-1 | 1 | <5 | <5 |
| 2-27 | (18) | 2 | S1/S3 = 85/15 | 3 | W-2 | 1 | <5 | 15 |
| 2-28 | (19) | 4 | S1/S5 = 40/60 | 2 | W-3 | 2 | 5 | 5 |
| 2-29 | (20) | 2 | S2/S3 = 80/20 | 2 | W-1 | 2 | 5 | 5 |
| 2-30 | (21) | 3 | S1/S3 = 85/15 | 2 | W-2 | 1 | <5 | <5 |
| 2-31 | (22) | 4 | S1/S5 = 70/30 | 1 | W-3 | 1 | <5 | <5 |
| 2-32 | (23) | 1 | S1/S3 = 70/30 | 1 | W-4 | 2 | 10 | 10 |
| 2-33 | (24) | 2 | S1/S5 = 50/50 | 1 | W-1 | 1 | <5 | <5 |
| 2-34 | (25) | 3 | S1/S4 = 80/20 | 2 | W-2 | 1 | <5 | <5 |
| Comparative Example 2 | (A4) | 1 | S6/S3 = 70/30 | 3 | — | 50 | 50 | 2000 |

As apparent from the results, the photoresist composition of Comparative Example 2 is poor in the storage stability of the resist solution. On the other hand, the positive-working photoresist compositions of the invention are on a satisfactory level in respect to the storage stability of the resist solutions. That is to say, they are suitable for lithography using far ultraviolet ray exposure including ArF excimer laser exposure.

EXAMPLES 3-1 TO 3-34

Comparative Example 3

Resist compositions were prepared in the same manner as with Examples 2-1 to 2-34 with the exception that the solvents used were changed to solvents shown in Table 7, and evaluated in the same manner as with Examples 2-1 to 2-34. Results thereof are shown in Table 7.

(Evaluation Tests)

The resulting positive-working photoresist solution was applied onto a silicon wafer with a spin coater, and dried at 140° C. for 90 seconds to prepare a positive-working photoresist film having a thickness of about 0.5 μm, which was exposed to an ArF excimer laser beam (wavelength:193 nm, stepper of NA=0.55). After exposure, heat treatment was

TABLE 7

| Example | Resin | Photoacid Generator | Solvent (weight ratio) | Organic Basic Compound | Surfactant | Sensitivity Variation (%) | Initial Value of Particles | Increase in Number of Particles |
|---|---|---|---|---|---|---|---|---|
| 3-1 | (1)-1 | 1 | S1/S8 = 90/10 | 1 | W-1 | 3 | <5 | <5 |
| 3-2 | (1)-2 | 2 | S1/S6 = 95/5 | 2 | W-2 | 3 | <5 | <5 |
| 3-3 | (1)-3 | 3 | S1/S6 = 90/10 | 1 | W-3 | 3 | <5 | <5 |
| 3-4 | (2)-1 | 4 | S1/S7 = 95/5 | 3 | W-1 | 6 | <5 | 25 |
| 3-5 | (2)-2 | 1 | S1/S6 = 90/10 | 2 | W-4 | 4 | 10 | 10 |
| 3-6 | (2)-3 | 2 | S2/S6 = 90/10 | 1 | W-1 | 5 | <5 | <5 |
| 3-7 | (3)-1 | 3 | S2/S7 = 90/10 | 2 | W-2 | 5 | <5 | <5 |
| 3-8 | (3)-2 | 4 | S1/S8 = 95/5 | 1 | W-3 | 3 | <5 | <5 |
| 3-9 | (4) | 3 | S1/S8 = 80/20 | 1 | W-1 | 4 | <5 | <5 |
| 3-10 | (5) | 4 | S1/S6 = 95/5 | 2 | W-2 | 3 | <5 | <5 |
| 3-11 | (6) | 1 | S1/S6 = 90/10 | 1 | W-3 | 3 | <5 | <5 |
| 3-12 | (7) | 1 | S1/S7 = 90/10 | 2 | W-1 | 3 | <5 | <5 |
| 3-13 | (8)-1 | 1 | S1/S8 = 90/10 | 2 | W-4 | 4 | 10 | 15 |
| 3-14 | (8)-2 | 3 | S1/S8 = 90/10 | 2 | W-3 | 2 | <5 | <5 |
| 3-15 | (9)-1 | 1 | S1/S6 = 92/8 | 2 | W-1 | 3 | <5 | <5 |
| 3-16 | (9)-2 | 3 | S1/S6 = 95/5 | 3 | W-1 | 4 | <5 | 15 |
| 3-17 | (9)-3 | 1 | S1/S8 = 75/25 | 1 | W-2 | 5 | <5 | <5 |
| 3-18 | (10)-1 | 4 | S2/S7 = 90/10 | 2 | W-3 | 4 | <5 | <5 |
| 3-19 | (10)-2 | 1 | S1/S8 = 92/8 | 1 | W-1 | 2 | <5 | <5 |
| 3-20 | (11) | 2 | S1/S8 = 95/5 | 1 | W-2 | 2 | <5 | <5 |
| 3-21 | (12) | 3 | S1/S6 = 90/10 | 2 | W-3 | 2 | <5 | <5 |
| 3-22 | (13) | 4 | S1/S7 = 90/10 | 2 | W-1 | 3 | <5 | <5 |
| 3-23 | (14) | 2 | S1/S6 = 80/20 | 3 | W-2 | 7 | <5 | 25 |
| 3-24 | (15) | 3 | S1/S6 = 95/5 | 2 | W-3 | 3 | <5 | <5 |
| 3-25 | (16) | 4 | S1/S7 = 90/10 | 2 | W-4 | 4 | 10 | 10 |
| 3-26 | (17) | 3 | S1/S8 = 90/10 | 1 | W-1 | 1 | <5 | <5 |
| 3-27 | (18) | 2 | S1/S6 = 85/15 | 3 | W-2 | 2 | <5 | 15 |
| 3-28 | (19) | 4 | S1/S8 = 90/10 | 2 | W-3 | 2 | <5 | <5 |
| 3-29 | (20) | 2 | S2/S6 = 95/5 | 2 | W-1 | 1 | <5 | <5 |
| 3-30 | (21) | 3 | S1/S6 = 85/15 | 2 | W-2 | 2 | <5 | <5 |
| 3-31 | (22) | 4 | S1/S8 = 90/10 | 1 | W-4 | 2 | 5 | 15 |
| 3-32 | (23) | 1 | S1/S6 = 92/8 | 1 | W-1 | 2 | <5 | <5 |
| 3-33 | (24) | 2 | S1/S8 = 97/3 | 1 | W-3 | 1 | <5 | <5 |
| 3-34 | (25) | 3 | S1/S7 = 95/5 | 2 | W-2 | 1 | <5 | <5 |
| Comparative Example 3 | (A4) | 1 | S6/S7 = 70/30 | 3 | — | 50 | 50 | 2000 |

S6: γ-Butyrolactone
S7: Ethylene carbonate
S8: Propylene carbonate

As apparent from the results, the photoresist composition of Comparative Example 3 is poor in the storage stability of the resist solution. On the other hand, the positive-working photoresist compositions of the invention are on a satisfactory level in respect to the storage stability of the resist solutions. That is to say, they are suitable for lithography using far ultraviolet ray exposure including ArF excimer laser exposure.

EXAMPLE 4-1 TO 4-34

Comparative Example 4

Resist compositions were prepared in the same manner as with Examples 2-1 to 2-34 with the exception that the solvents used were chanced to solvents shown in Table 8.

carried out at 12° C. for 90 seconds. Then, the photoresist film was developed with a 2.38% aqueous solution of tetramethyl-ammonium hydroxide, and rinsed with distilled water to obtain a resist pattern profile.

The edge roughness of the resist composition was evaluated in the following manner.

The edge roughness was measured for the edge roughness of an isolated pattern by using a measuring scanning electron microscope (SEM), and a line pattern edge was detected at a plurality of positions in a measuring monitor. The dispersion in variation (3σ) of the detection positions is taken as a measure of the edge roughness. It is preferred that this value is smaller.

Results thereof are shown in Table 8.

TABLE 8

| Example | Resin | Photoacid Generator | Solvent (weight ratio) | Organic Basic Compound | Surfactant | Edge Roughness (nm) |
|---|---|---|---|---|---|---|
| 4-1 | (1)-1 | 1 | S9/S3 = 70/30 | 3 | — | 8 |
| 4-2 | (1)-2 | 2 | S9/S4 = 90/10 | 2 | W-1 | 6 |
| 4-3 | (1)-3 | 3 | S9/S5 = 80/20 | 1 | W-2 | 6 |
| 4-4 | (2)-1 | 4 | S9/S3 = 80/20 | 2 | W-3 | 6 |
| 4-5 | (2)-2 | 1 | S9/S5 = 75/25 | 2 | W-4 | 7 |
| 4-6 | (2)-3 | 2 | S9/S4 = 85/15 | 3 | W-1 | 8 |
| 4-7 | (3)-1 | 3 | S9/S5 = 85/15 | 1 | W-2 | 6 |
| 4-8 | (3)-2 | 4 | S9/S3 = 85/15 | 2 | W-3 | 6 |
| 4-9 | (4) | 3 | S9/S4 = 85/15 | 2 | W-3 | 6 |
| 4-10 | (5) | 4 | S9/S5 = 80/20 | 1 | W-1 | 6 |
| 4-11 | (6) | 1 | S9/S4 = 90/10 | 2 | W-2 | 6 |
| 4-12 | (7) | 1 | S9/S5 = 70/30 | 2 | W-3 | 6 |
| 4-13 | (8)-1 | 1 | S9/S3 = 85/15 | 2 | W-1 | 5 |
| 4-14 | (8)-2 | 3 | S9/S3 = 70/30 | 2 | W-2 | 5 |
| 4-15 | (9)-1 | 1 | S9/S4 = 90/10 | 2 | W-1 | 5 |
| 4-16 | (9)-2 | 3 | S9/S3 = 40/60 | 3 | W-2 | 7 |
| 4-17 | (9)-3 | 1 | S9/S4 = 85/15 | 1 | W-4 | 7 |
| 4-18 | (10)-1 | 4 | S9/S5 = 80/20 | 1 | W-1 | 5 |
| 4-19 | (10)-2 | 1 | S9/S3 = 80/20 | 2 | W-2 | 5 |
| 4-20 | (11) | 2 | S9/S3 = 75/25 | 1 | W-4 | 8 |
| 4-21 | (12) | 3 | S9/S4 = 95/5 | 2 | W-1 | 6 |
| 4-22 | (13) | 4 | S9/S3 = 85/15 | 2 | W-2 | 4 |
| 4-23 | (14) | 2 | S9/S4 = 90/10 | 3 | W-3 | 6 |
| 4-24 | (15) | 3 | S9/S5 = 80/20 | 1 | W-3 | 4 |
| 4-25 | (16) | 4 | S9/S5 = 75/25 | 1 | W-4 | 7 |
| 4-26 | (17) | 3 | S9/S3 = 80/20 | 2 | W-1 | 4 |
| 4-27 | (18) | 2 | S9/S5 = 85/15 | 3 | W-2 | 7 |
| 4-28 | (19) | 4 | S9/S3 = 60/40 | 2 | W-1 | 4 |
| 4-29 | (20) | 2 | S9/S4 = 90/10 | 2 | W-2 | 4 |
| 4-30 | (21) | 3 | S9/S4 = 85/15 | 2 | W-4 | 7 |
| 4-31 | (22) | 4 | S9/S5 = 70/30 | 1 | W-3 | 4 |
| 4-32 | (23) | 1 | S9/S5 = 70/30 | 2 | W-4 | 6 |
| 4-33 | (24) | 2 | S9/S5 = 50/50 | 1 | W-2 | 3 |
| 4-34 | (25) | 3 | S9/S5 = 80/20 | 2 | W-1 | 3 |
| Comparative Example 4 | (A4) | 1 | S9/S3 = 70/30 | 3 | — | 25 |

S3: Ethyl lactate
S4: Propylene glycol monomethyl ether
S5: Ethoxyethyl propionate
S9: 2-Heptanone As apparent from the results, the photoresist composition of Comparative Example 4 is poor in the edge roughness of the resist solution. On the other hand, the positive-working photoresist compositions of the invention are on a satisfactory level in respect to the edge roughness of the resist solutions. That is to say, they are suitable for lithography using far ultraviolet ray exposure including ArF excimer laser exposure.

EXAMPLES 5-1 TO 5-34

Comparative Example 5

Resist compositions were prepared in the same manner as with Examples 2-1 to 2-34 with the exception that the solvents used were changed to solvents shown in Table 9, and evaluated in the same manner as with Examples 2-1 to 2-34. Results thereof are shown in Table 9.

TABLE 9

| Example | Resin | Photoacid Generator | Solvent (weight ratio) | Organic Basic Compound | Surfactant | Sensitivity Variation (%) | Initial Value of Particles | Increase in Number of Particles |
|---|---|---|---|---|---|---|---|---|
| 5-1 | (1)-1 | 1 | S9/S6 = 97/3 | 2 | W-1 | 3 | <5 | <5 |
| 5-2 | (1)-2 | 2 | S9/S7 = 95/5 | 3 | W-2 | 5 | <5 | 20 |
| 5-3 | (1)-3 | 3 | S9/S8 = 95/5 | 1 | W-2 | 3 | <5 | <5 |
| 5-4 | (2)-1 | 4 | S9/S6 = 95/5 | 1 | W-1 | 3 | <5 | <5 |
| 5-5 | (2)-2 | 1 | S9/S7 = 97/3 | 1 | W-4 | 4 | 10 | 15 |
| 5-6 | (2)-3 | 2 | S9/S7 = 85/15 | 2 | W-2 | 6 | <5 | <5 |
| 5-7 | (3)-1 | 3 | S9/S8 = 92/8 | 2 | W-2 | 5 | <5 | <5 |
| 5-8 | (3)-2 | 4 | S9/S6 = 97/3 | 2 | W-1 | 3 | <5 | <5 |
| 5-9 | (4) | 3 | S9/S6 = 90/10 | 2 | W-1 | 4 | <5 | <5 |
| 5-10 | (5) | 4 | S9/S7 = 95/5 | 2 | W-1 | 3 | <5 | <5 |
| 5-11 | (6) | 1 | S9/S7 = 95/5 | 3 | W-3 | 5 | <5 | 15 |
| 5-12 | (7) | 1 | S9/S8 = 95/5 | 2 | W-3 | 3 | <5 | <5 |

TABLE 9-continued

| Example | Resin | Photoacid Generator | Solvent (weight ratio) | Organic Basic Compound | Surfactant | Sensitivity Variation (%) | Initial Value of Particles | Increase in Number of Particles |
|---|---|---|---|---|---|---|---|---|
| 5-13 | (8)-1 | 1 | S9/S6 = 96/4 | 1 | W-2 | 2 | <5 | <5 |
| 5-14 | (8)-2 | 3 | S9/S6 = 95/5 | 2 | W-3 | 2 | <5 | <5 |
| 5-15 | (9)-1 | 1 | S9/S7 = 97/3 | 2 | W-4 | 3 | 10 | 10 |
| 5-16 | (9)-2 | 3 | S9/S7 = 96/4 | 3 | W-1 | 4 | <5 | 15 |
| 5-17 | (9)-3 | 1 | S9/S8 = 95/5 | 1 | W-2 | 2 | <5 | <5 |
| 5-18 | (10)-1 | 4 | S9/S8 = 97/3 | 2 | W-3 | 4 | <5 | <5 |
| 5-19 | (10)-2 | 1 | S9/S6 = 93/7 | 1 | W-1 | 2 | <5 | <5 |
| 5-20 | (11) | 2 | S9/S6 = 97/3 | 2 | W-2 | 2 | <5 | <5 |
| 5-21 | (12) | 3 | S9/S7 = 95/5 | 2 | W-2 | 2 | <5 | <5 |
| 5-22 | (13) | 4 | S9/S7 = 95/5 | 1 | W-3 | 3 | <5 | <5 |
| 5-23 | (14) | 2 | S9/S7 = 95/5 | 3 | W-1 | 5 | <5 | 25 |
| 5-24 | (15) | 3 | S9/S7 = 80/20 | 2 | W-2 | 5 | <5 | <5 |
| 5-25 | (16) | 4 | S9/S6 = 90/10 | 2 | W-4 | 5 | 10 | 10 |
| 5-26 | (17) | 3 | S9/S8 = 95/5 | 1 | W-3 | 1 | <5 | <5 |
| 5-27 | (18) | 2 | S9/S8 = 96/4 | 3 | W-2 | 1 | <5 | 15 |
| 5-28 | (19) | 4 | S9/S6 = 95/5 | 2 | W-1 | 1 | <5 | <5 |
| 5-29 | (20) | 2 | S9/S6 = 94/6 | 2 | W-3 | 1 | <5 | <5 |
| 5-30 | (21) | 3 | S9/S7 = 95/5 | 2 | W-1 | 1 | <5 | <5 |
| 5-31 | (22) | 4 | S9/S7 = 92/8 | 1 | W-2 | 2 | <5 | <5 |
| 5-32 | (23) | 1 | S9/S7 = 90/10 | 1 | W-4 | 3 | 10 | 10 |
| 5-33 | (24) | 2 | S9/S6 = 95/5 | 1 | W-1 | 1 | <5 | <5 |
| 5-34 | (25) | 3 | S9/S8 = 96/4 | 2 | W-2 | 1 | <5 | <5 |
| Comparative Example 5 | (A4) | 1 | S9/S5 = 70/30 | 3 | — | 50 | 50 | 2000 |

S6: γ-Butyrolactone
S7: Ethylene carbonate
S8: Propylene carbonate
S9: 2-Heptanone As apparent from the results, the photoresist composition of Comparative Example 5 is poor in the storage stability of the resist solution. On the other hand, the positive-working photoresist compositions of the invention are on a satisfactory level in respect to the storage stability of the resist solutions. That is to say, they are suitable for lithography using far ultraviolet ray exposure including ArF excimer laser exposure.

The positive-working photoresist compositions for far ultraviolet ray exposure of the invention is sufficiently suitable particularly for light within the wavelength region of 170 nm to 220 nm, and are excellent in the storage stability of the resist solutions.

What is claimed is:

1. A positive-working photoresist composition comprising (i) a compound generating an acid by irradiation of active light or radiation, and (ii) at least one resin comprising (a) repeating units having alkali-soluble groups each protected with at least one group selected from the group consisting of groups containing alicyclic hydrocarbon structures represented by the following general formulas (pI) to (pVI), (b) repeating units represented by the following general formula (II) and (c) repeating units represented by the following general formulas (III-a) to (III-d), and decomposed by the action of an acid to increase the solubility of the resin into an alkali;

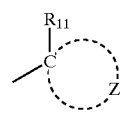 (pI)

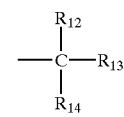 (pII)

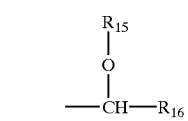 (pIII)

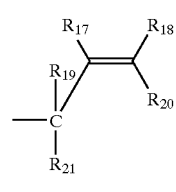 p(IV)

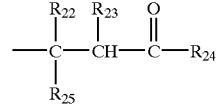 (pV)

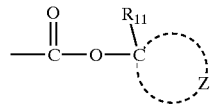 (pVI)

wherein $R_{11}$ represents a methyl group, an ethyl group, a n-propyl group, an isopropyl group, a n-butyl group, an isobutyl group or a sec-butyl group; z represents an atomic group necessary to form an alicyclic hydrocarbon group together with a carbon atom; $R_{12}$ to $R_{16}$ each independently represents a straight-chain or branched alkyl group having 1 to 4 carbon atoms or an alicyclic hydrocarbon group, with the proviso that at least one of $R_{12}$ to $R_{14}$ or either of $R_{15}$ and $R_{16}$ represents an alicyclic hydrocarbon group; $R_{17}$ to $R_{21}$ each independently represents a hydrogen atom, a straight-chain or branched alkyl group having 1 to 4 carbon atoms or an alicyclic hydrocarbon group, with the proviso that at least one of $R_{17}$ to $R_{21}$ represents an alicyclic hydrocarbon group; further, either of $R_{19}$ and $R_{21}$ represents a straight-chain or branched alkyl group having 1 to 4 carbon atoms or an alicyclic hydrocarbon group; and $R_{22}$ to $R_{25}$ each independently represents a straight-chain or branched alkyl group having 1 to 4 carbon atoms or an alicyclic hydrocarbon group, with the proviso that at least one of $R_{22}$ to $R_{25}$ represents an alicyclic hydrocarbon group;

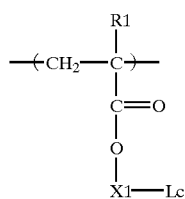

(II)

wherein R1 represents a hydrogen atom, a halogen atom or a straight-chain or branched alkyl group having 1 to 4 carbon atoms; X1 represents a single bond; and Lc represents a lactone group; and

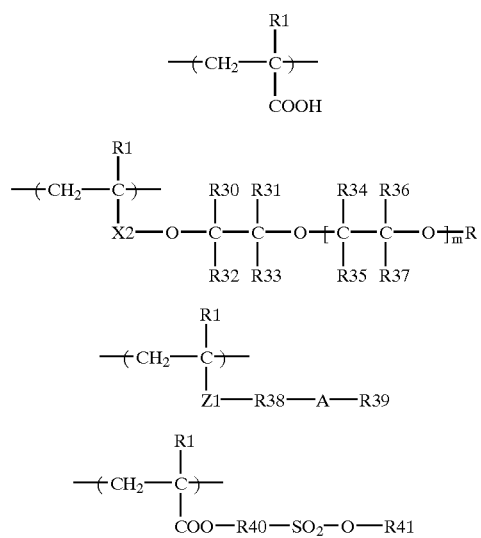

(III-a)

(III-b)

(III-c)

(III-d)

wherein R1 represents a hydrogen atom, a halogen atom or a straight-chain or branched alkyl group having 1 to 4 carbon atoms; R30 to R37 each independently represents a hydrogen atom or an alkyl group which may have a substituent; R represents a hydrogen atom or an alkyl, cyclic alkyl, aryl or aralkyl group which may have a substituent; m represents an integer of 1 to 10; X2 represents a divalent group selected from the group consisting of a single bond, an alkylene group, a cyclic alkylene group, an arylene group, an ether group, a thioether group, a carbonyl group, an ester group, an amido group, a sulfonamido group, a urethane group and a urea group, which may have substituents, may be used alone or as a combination of two or more of them, and are not decomposed by the action of an acid; Z1 represents a single bond, an ether group, an ester group, an amido group, an alkylene group or a divalent group in which they are combined; R38 represents a single bond, an alkylene group, an arylene group or a divalent group in which they are combined; R40 represents an alkylene group, an arylene group or a divalent group in which they are combined; R39 represents an alkyl, cyclic alkyl, aryl or aralkyl group which may have a substituent; R41 represents a hydrogen atom or an alkyl, cyclic alkyl alkenyl, aryl or aralkyl group which may have a substituent; and A represents any one of the following functional groups:

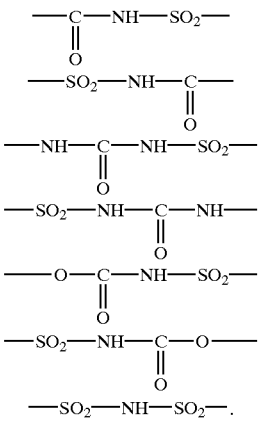

2. The positive-working photoresist composition according to claim 1, wherein the resin of (ii) is a resin containing repeating units of at least one kind selected from the group consisting of repeating units represented by the following general formula (I'), repeating units represented by the following general formula (II') and repeating units represented by general formulas (III-a) to (III-d), and increased in the rate of dissolution into an alkali developing solution by the action of an acid;

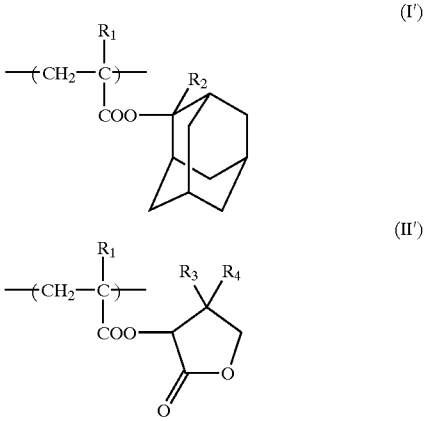

(I')

(II')

wherein $R_1$ represents a hydrogen atom or a methyl group; $R_2$ represents an alkyl group having 1 to 4 carbon atoms; and $R_3$ and $R_4$ each independently represents a hydrogen atom or an alkyl group having 1 to 4 carbon atoms.

3. The positive-working photoresist composition according to claim 1 further comprising (iii) a mixed solvent selected from the group consisting of (iii-1) a mixed solvent containing (1) propylene glycol monomethyl ether acetate or propylene glycol monomethyl ether propionate and (2) at least one of ethyl lactate, propylene glycol monomethyl ether and ethoxyethyl propionate; (iii-2) a mixed solvent containing (1) propylene glycol monomethyl ether acetate or propylene glycol monomethyl ether propionate and (2) at least one of γ-butyrolactone, ethylene carbonate and propylene carbonate; (iii-3) a mixed solvent containing (1) heptanone and (2) at least one of ethyl lactate, propylene glycol monomethyl ether and ethoxyethyl propionate; and (iii-4) a mixed solvent containing (1) heptanone and (2) at least one of γ-butyrolactone, ethylene carbonate and propylene carbonate.

4. The positive-working photoresist composition according to claim 1 further comprising (iv) an organic basic compound.

5. The positive-working photoresist composition according to claim 1 further comprising (v) a fluorine and/or silicon surfactant.

6. The positive working photoresist composition according to claim 1, where said resin contains 20 mol % to 70 mol % of the repeating units having alkali-soluble groups each protected with at least one group selected from the group consisting of groups containing alicyclic hydrocarbon structures represented by general formulas (pI) to (pVI), based on the total repeating units.

7. The positive working photoresist composition according to claim 1, where said resin contains 20 mol % to 70 mol % of the repeating units represented by general formula (II), based on the total repeating units.

8. The positive working photoresist composition according to claim 1, where said resin contains 0.1 mol % to 20 mol % of the repeating units represented by general formulas (III-a) to (III-d), based on the total repeating units.

* * * * *